(12) United States Patent
Ishioka

(10) Patent No.: US 8,748,213 B2
(45) Date of Patent: Jun. 10, 2014

(54) LIGHT TRANSMISSION MEMBER, IMAGE PICKUP DEVICE, AND METHOD OF MANUFACTURING SAME

(71) Applicant: Canon Kabushiki Kaisha, Tokyo (JP)

(72) Inventor: Masao Ishioka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/773,281

(22) Filed: Feb. 21, 2013

(65) Prior Publication Data

US 2013/0224897 A1 Aug. 29, 2013

(30) Foreign Application Priority Data

Feb. 24, 2012 (JP) .................. 2012-038881

(51) Int. Cl.
*H01L 21/00* (2006.01)
(52) U.S. Cl.
USPC ............................. 438/70; 438/69; 348/273
(58) Field of Classification Search
USPC ...................................... 438/69, 70; 348/273
See application file for complete search history.

(56) References Cited

U.S. PATENT DOCUMENTS

| | | | |
|---|---|---|---|
| 2006/0097297 A1* | 5/2006 | Lee ............................. | 257/292 |
| 2008/0185505 A1* | 8/2008 | Mizuno et al. ............ | 250/231.13 |
| 2010/0092143 A1* | 4/2010 | Ushiwata et al. ............. | 385/129 |
| 2010/0141812 A1 | 6/2010 | Hirota | |
| 2010/0155582 A1* | 6/2010 | Hirano et al. ............ | 250/227.11 |
| 2010/0259766 A1* | 10/2010 | Wiese et al. .................. | 356/614 |
| 2010/0315541 A1 | 12/2010 | Egawa | |
| 2012/0127579 A1* | 5/2012 | Black et al. .................. | 359/601 |
| 2013/0208153 A1* | 8/2013 | Takano ......................... | 348/265 |

FOREIGN PATENT DOCUMENTS

| | | |
|---|---|---|
| JP | 2007048774 A | 2/2007 |
| JP | 2009130575 A | 6/2009 |
| JP | 2010020055 A | 1/2010 |
| JP | 2010136226 A | 6/2010 |
| JP | 2010147143 A | 7/2010 |
| JP | 2010288150 A | 12/2010 |
| JP | 2011243817 A | 12/2011 |

\* cited by examiner

*Primary Examiner* — Alexander Ghyka

(74) *Attorney, Agent, or Firm* — Canon USA Inc. IP Division

(57) ABSTRACT

A method of forming a light transmission member includes a plurality of processes to form a plurality of sections of the light transmission member. Notably, after a first class process to form light transmission portions having narrow-band light transmission properties in a first class section group, a second class process is performed to form light transmission portions in a second class section group, and a fourth class process is performed to form light transmission portions having wideband light transmission properties in a first section.

20 Claims, 20 Drawing Sheets

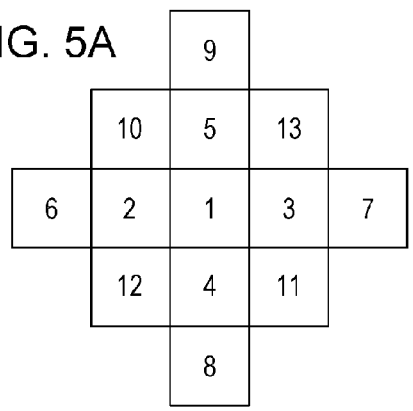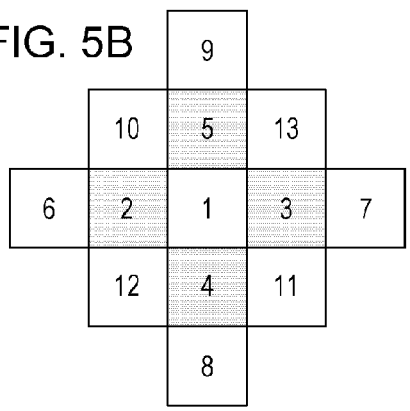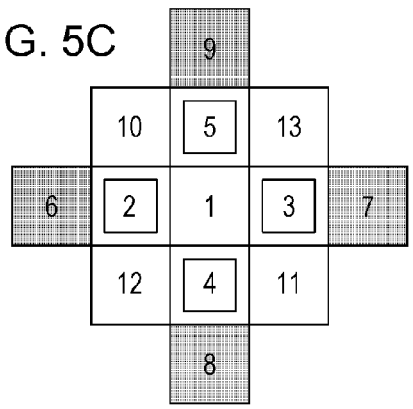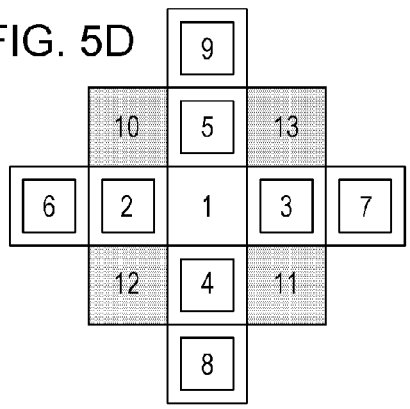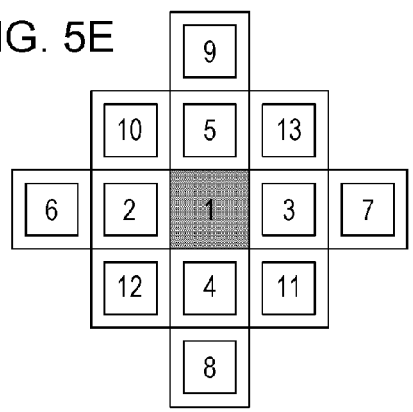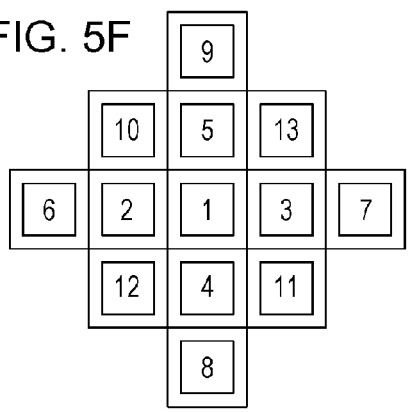
 ... FIRST CLASS SECTION GROUP  ... SECOND CLASS SECTION GROUP  ... THIRD CLASS SECTION GROUP

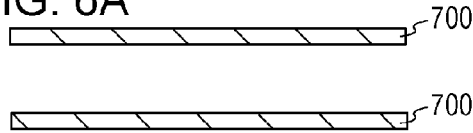
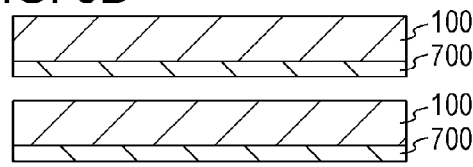
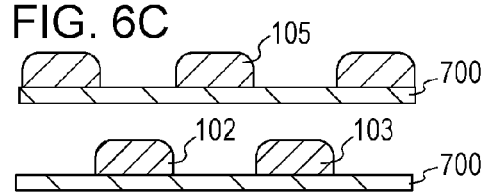
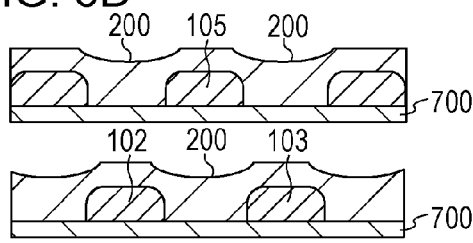
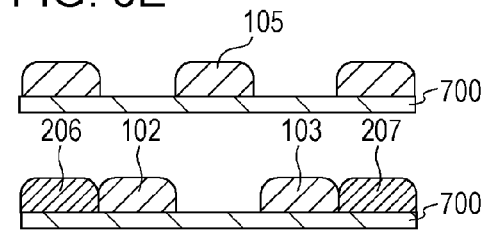
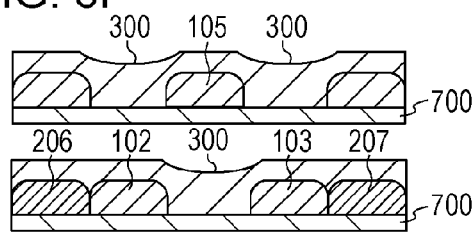
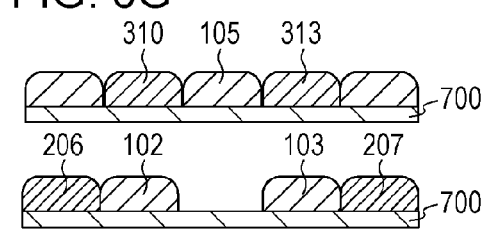
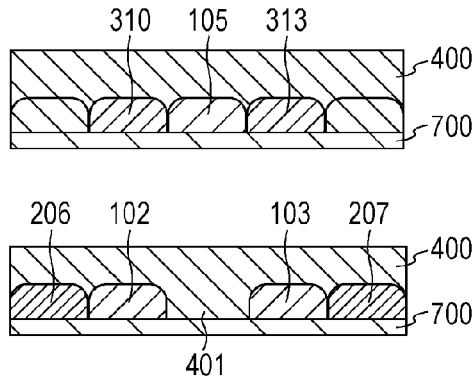
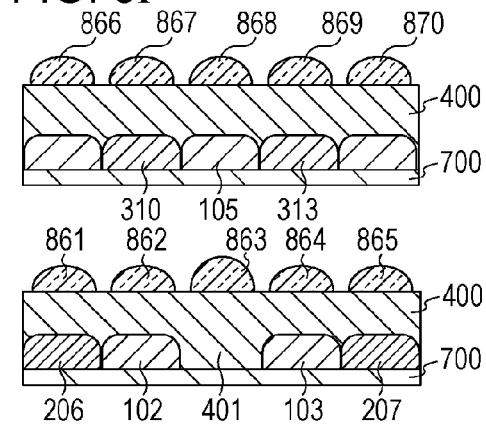

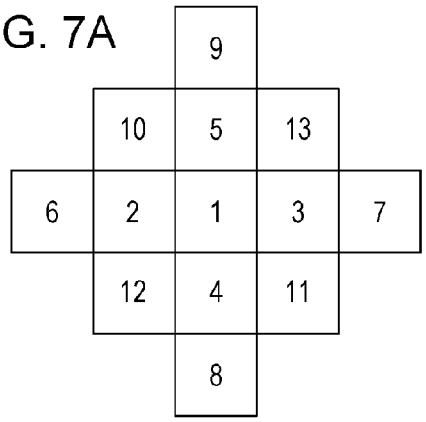
FIG. 7A
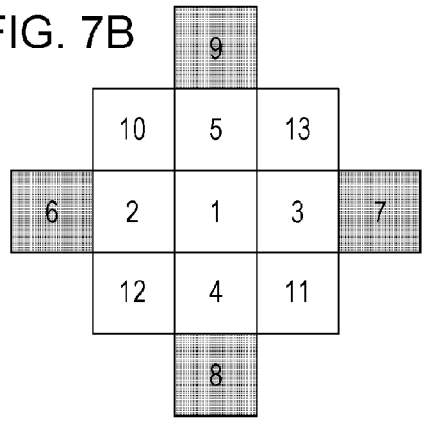
FIG. 7B
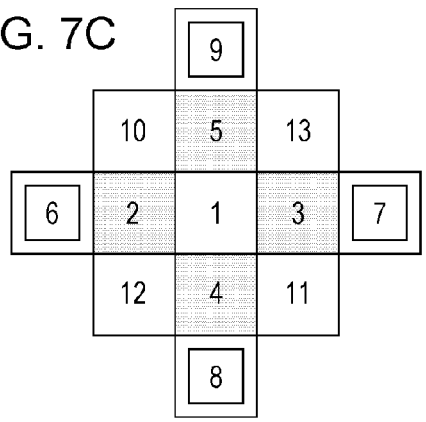
FIG. 7C
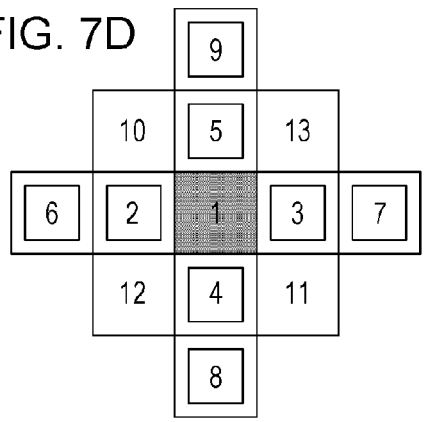
FIG. 7D
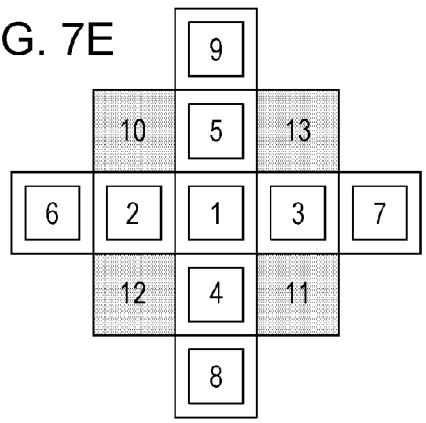
FIG. 7E
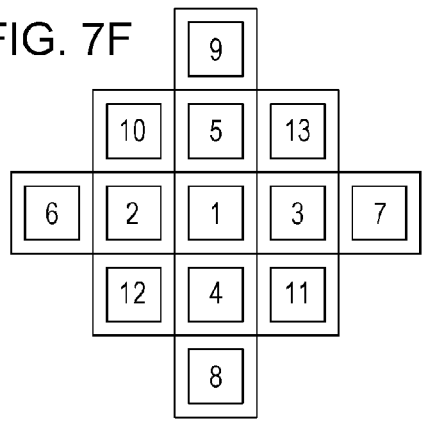
FIG. 7F
 ··· FIRST CLASS SECTION GROUP    ··· SECOND CLASS SECTION GROUP    ··· THIRD CLASS SECTION GROUP

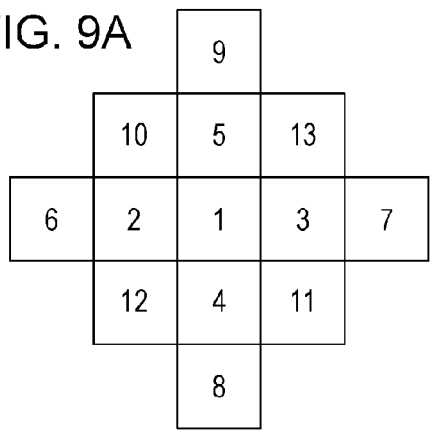
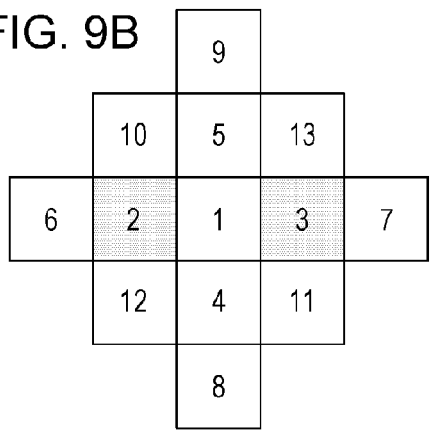
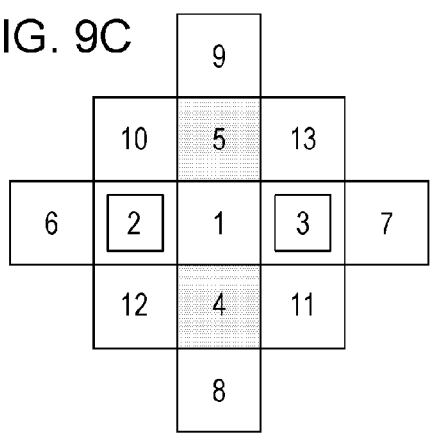
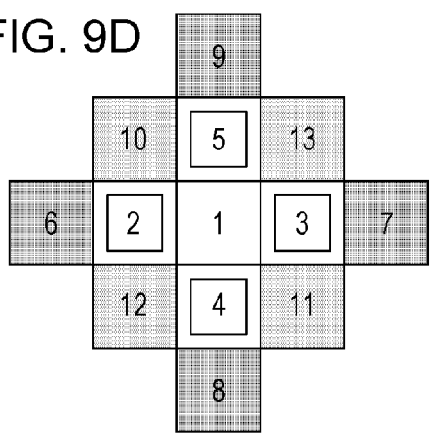
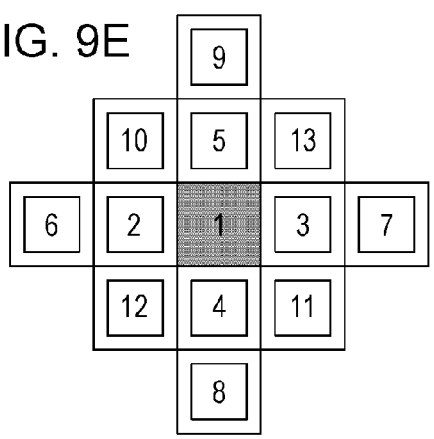
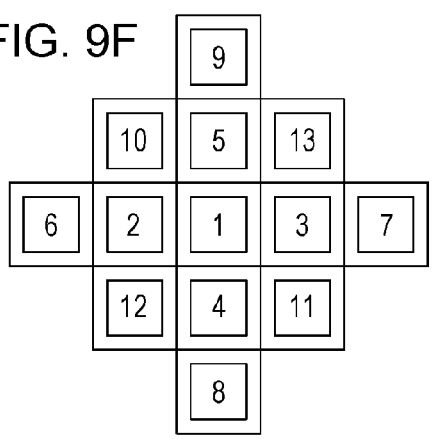
... FIRST CLASS SECTION GROUP   ... SECOND CLASS SECTION GROUP   ... THIRD CLASS SECTION GROUP

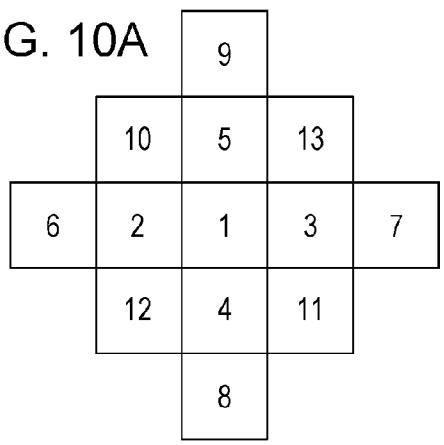
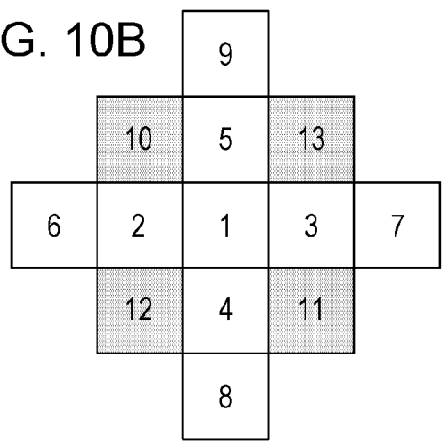
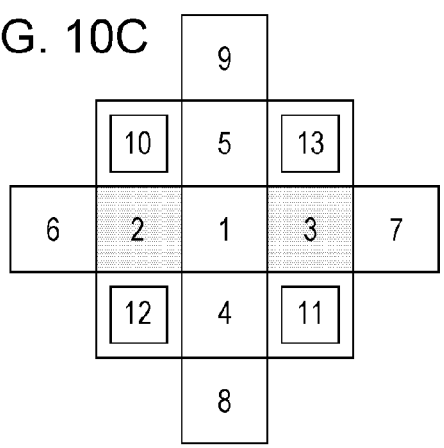
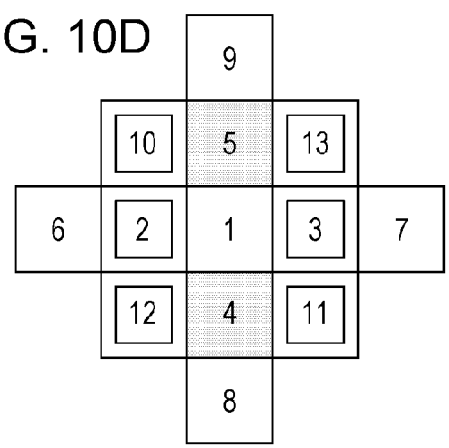
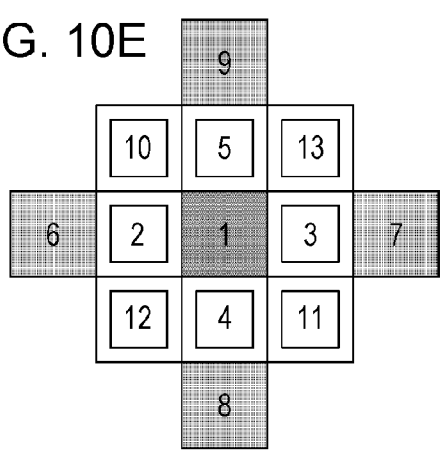
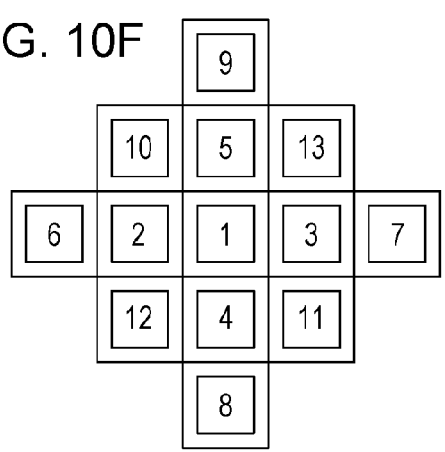
 ... FIRST CLASS SECTION GROUP     ... SECOND CLASS SECTION GROUP     ... THIRD CLASS SECTION GROUP

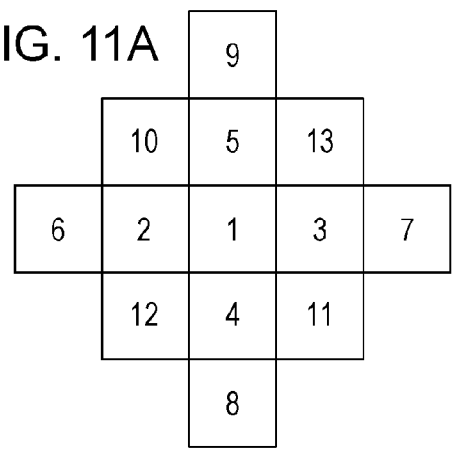
FIG. 11A
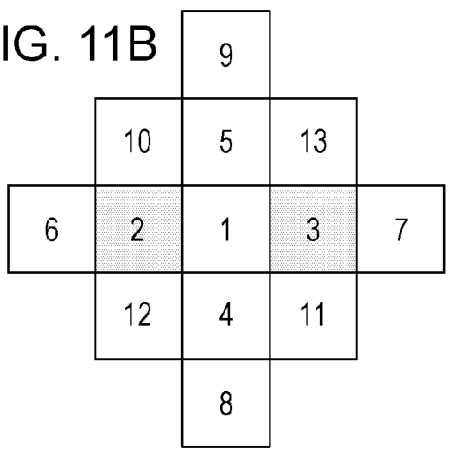
FIG. 11B
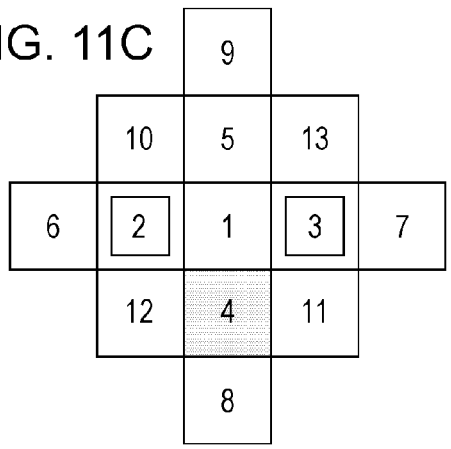
FIG. 11C
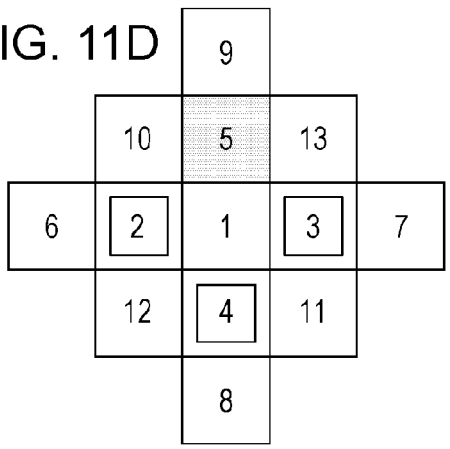
FIG. 11D
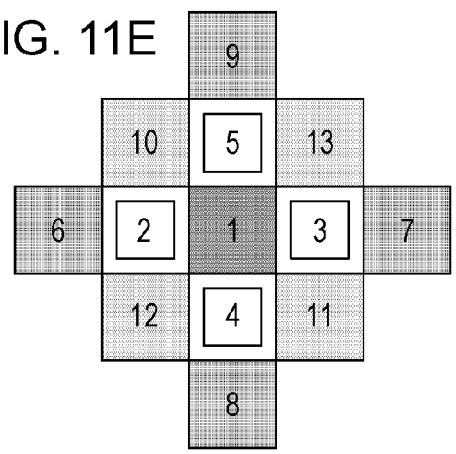
FIG. 11E
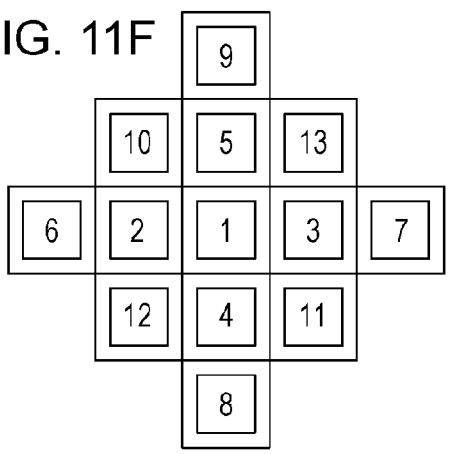
FIG. 11F
 ··· FIRST CLASS SECTION GROUP   ··· SECOND CLASS SECTION GROUP   ··· THIRD CLASS SECTION GROUP

|     | C01 | C02 | C03 | C04 | C05 | C06 | C07 | C08 | C09 | C10 | C11 | C12 | C13 | C14 | C15 | C16 |
|-----|-----|-----|-----|-----|-----|-----|-----|-----|-----|-----|-----|-----|-----|-----|-----|-----|
| R01 | R | G | R | G | R | G | R | G | R | G | R | G | R | G | R | G |
| R02 | G | B | G | B | G | B | G | B | G | B | G | B | G | B | G | B |
| R03 | R | G |   | G | R | G | R | G | R | G | R | G | R | G |   | G |
| R04 | G | B | G | B | G | B | G | B | G | B | G | B | G | B | G | B |
| R05 | R | G | R | G | R | G | R | G |   | G | R | G | R | G | R | G |
| R06 | G |   | G | B | G | B | G | B | G | B | G | B | G |   | G | B |
| R07 | R | G | R | G | R | G | R | G | R | G | R | G | R | G | R | G |
| R08 | G | B | G | B | G | B | G | B | G | B | G | B | G | B | G | B |
| R09 | R | G | R | G | R | G | R | G | R | G | R | G | R | G | R | G |
| R10 | G | B | G | B | G | B | G |   | G | B | G | B | G | B | G | B |
| R11 | R | G | R | G | R | G | R | G | R | G | R | G | R | G | R | G |
| R12 | G | B | G | B | G | B | G | B | G | B | G | B | G |   | G | B |
| R13 | R | G | R | G | R | G | R | G | R | G | R | G | R | G | R | G |
| R14 | G | B | G | B | G | B | G | B | G | B | G | B | G | B | G | B |
| R15 | R | G |   | G | R | G | R | G | R | G | R | G | R | G | R | G |
| R16 | G | B | G | B | G | B | G | B | G | B | G | B | G | B | G | B |

FIG. 13D

|     | C01 | C02 | C03 | C04 | C05 | C06 | C07 | C08 | C09 | C10 | C11 | C12 | C13 | C14 | C15 | C16 |
|-----|-----|-----|-----|-----|-----|-----|-----|-----|-----|-----|-----|-----|-----|-----|-----|-----|
| R01 | R | G | R | G | R | G | R | G | R | G | R | G | R | G | R | G |
| R02 | G | B | G | B | G | B | G | B | G | B | G | B | G | B | G | B |
| R03 | R | G | W | G | R | G | R | G | R | G | R | G | R | G | W | G |
| R04 | G | B | G | B | G | B | G | B | G | B | G | B | G | B | G | B |
| R05 | R | G | R | G | R | G | R | G | W | G | R | G | R | G | R | G |
| R06 | G | W | G | B | G | B | G | B | G | B | G | B | G | W | G | B |
| R07 | R | G | R | G | R | G | R | G | R | G | R | G | R | G | R | G |
| R08 | G | B | G | B | G | B | G | B | G | B | G | B | G | B | G | B |
| R09 | R | G | R | G | R | G | R | G | R | G | R | G | R | G | R | G |
| R10 | G | B | G | B | G | B | G | W | G | B | G | B | G | B | G | B |
| R11 | R | G | R | G | R | G | R | G | R | G | R | G | R | G | R | G |
| R12 | G | B | G | B | G | B | G | B | G | B | G | B | G | W | G | B |
| R13 | R | G | R | G | R | G | R | G | R | G | R | G | R | G | R | G |
| R14 | G | B | G | B | G | B | G | B | G | B | G | B | G | B | G | B |
| R15 | R | G | W | G | R | G | R | G | R | G | R | G | R | G | R | G |
| R16 | G | B | G | B | G | B | G | B | G | B | G | B | G | B | G | B |

|     | C01 | C02 | C03 | C04 | C05 | C06 | C07 | C08 | C09 | C10 | C11 | C12 | C13 | C14 | C15 | C16 |
|-----|-----|-----|-----|-----|-----|-----|-----|-----|-----|-----|-----|-----|-----|-----|-----|-----|
| R01 | R | G | R | G | R | G | R | G | R | G | R | G | R | G | R | G |
| R02 | G | B | G | B | G | B | G | B | G | B | G | B | G | B | G | B |
| R03 | R | G | R |   | R | G | R | G | R | G | R | G | R |   | R | G |
| R04 | G | B | G | B | G | B | G | B | G | B | G | B | G | B | G | B |
| R05 | R | G | R | G | R | G | R |   | R | G | R | G | R | G | R | G |
| R06 | G | B |   | B | G | B | G | B | G | B | G | B |   | B | G | B |
| R07 | R | G | R | G | R | G | R | G | R | G | R | G | R | G | R | G |
| R08 | G | B | G | B | G | B | G | B | G | B | G | B | G | B | G | B |
| R09 | R | G | R | G | R | G | R | G | R | G | R | G | R | G | R | G |
| R10 | G | B | G | B | G | B |   | B | G | B | G | B | G | B | G | B |
| R11 | R | G | R | G | R | G | R | G | R | G | R | G | R | G | R | G |
| R12 | G | B | G | B | G | B | G | B | G | B | G | B | G | B |   | B |
| R13 | R | G | R | G | R | G | R | G | R | G | R | G | R | G | R | G |
| R14 | G | B | G | B | G | B | G | B | G | B | G | B | G | B | G | B |
| R15 | R | G | R |   | R | G | R | G | R | G | R | G | R | G | R | G |
| R16 | G | B | G | B | G | B | G | B | G | B | G | B | G | B | G | B |

FIG. 13H

|     | C01 | C02 | C03 | C04 | C05 | C06 | C07 | C08 | C09 | C10 | C11 | C12 | C13 | C14 | C15 | C16 |
|-----|-----|-----|-----|-----|-----|-----|-----|-----|-----|-----|-----|-----|-----|-----|-----|-----|
| R01 | R | G | R | G | R | G | R | G | R | G | R | G | R | G | R | G |
| R02 | G | B | G | B | G | B | G | B | G | B | G | B | G | B | G | B |
| R03 | R | G | R | W | R | G | R | G | R | G | R | G | R | W | R | G |
| R04 | G | B | G | B | G | B | G | B | G | B | G | B | G | B | G | B |
| R05 | R | G | R | G | R | G | R | W | R | G | R | G | R | G | R | G |
| R06 | G | B | W | B | G | B | G | B | G | B | G | B | W | B | G | B |
| R07 | R | G | R | G | R | G | R | G | R | G | R | G | R | G | R | G |
| R08 | G | B | G | B | G | B | G | B | G | B | G | B | G | B | G | B |
| R09 | R | G | R | G | R | G | R | G | R | G | R | G | R | G | R | G |
| R10 | G | B | G | B | G | B | W | B | G | B | G | B | G | B | G | B |
| R11 | R | G | R | G | R | G | R | G | R | G | R | G | R | G | R | G |
| R12 | G | B | G | B | G | B | G | B | G | B | G | B | W | B | G | B |
| R13 | R | G | R | G | R | G | R | G | R | G | R | G | R | G | R | G |
| R14 | G | B | G | B | G | B | G | B | G | B | G | B | G | B | G | B |
| R15 | R | G | R | W | R | G | R | G | R | G | R | G | R | G | R | G |
| R16 | G | B | G | B | G | B | G | B | G | B | G | B | G | B | G | B |

FIG. 14A

|     | C01 | C02 | C03 | C04 | C05 | C06 | C07 | C08 | C09 | C10 | C11 | C12 |
| --- | --- | --- | --- | --- | --- | --- | --- | --- | --- | --- | --- | --- |
| R01 | R | G | R | G | R | G | R | G | R | G | R | G |
| R02 | W | B | W | B | W | B | W | B | W | B | W | B |
| R03 | R | W | R | W | R | W | R | W | R | W | R | W |
| R04 | G | B | G | B | G | B | G | B | G | B | G | B |
| R05 | R | G | R | G | R | G | R | G | R | G | R | G |
| R06 | W | B | W | B | W | B | W | B | W | B | W | B |
| R07 | R | W | R | W | R | W | R | W | R | W | R | W |
| R08 | G | B | G | B | G | B | G | B | G | B | G | B |
| R09 | R | G | R | G | R | G | R | G | R | G | R | G |
| R10 | W | B | W | B | W | B | W | B | W | B | W | B |
| R11 | R | W | R | W | R | W | R | W | R | W | R | W |
| R12 | G | B | G | B | G | B | G | B | G | B | G | B |

FIG. 14B

|     | C01 | C02 | C03 | C04 | C05 | C06 | C07 | C08 | C09 | C10 | C11 | C12 |
| --- | --- | --- | --- | --- | --- | --- | --- | --- | --- | --- | --- | --- |
| R01 | R | G | R | W | R | G | R | W | R | G | R | W |
| R02 | W | B | G | B | W | B | G | B | W | B | G | B |
| R03 | R | W | R | G | R | W | R | G | R | W | R | G |
| R04 | G | B | W | B | G | B | W | B | G | B | W | B |
| R05 | R | G | R | W | R | G | R | W | R | G | R | W |
| R06 | W | B | G | B | W | B | G | B | W | B | G | B |
| R07 | R | W | R | G | R | W | R | G | R | W | R | G |
| R08 | G | B | W | B | G | B | W | B | G | B | W | B |
| R09 | R | G | R | W | R | G | R | W | R | G | R | W |
| R10 | W | B | G | B | W | B | G | B | W | B | G | B |
| R11 | R | W | R | G | R | W | R | G | R | W | R | G |
| R12 | G | B | W | B | G | B | W | B | G | B | W | B |

FIG. 14C

|     | C01 | C02 | C03 | C04 | C05 | C06 | C07 | C08 | C09 | C10 | C11 | C12 |
| --- | --- | --- | --- | --- | --- | --- | --- | --- | --- | --- | --- | --- |
| R01 | R | W | R | W | R | W | R | W | R | W | R | W |
| R02 | G | B | G | B | G | B | G | B | G | B | G | B |
| R03 | R | W | R | W | R | W | R | W | R | W | R | W |
| R04 | G | B | G | B | G | B | G | B | G | B | G | B |
| R05 | R | W | R | W | R | W | R | W | R | W | R | W |
| R06 | G | B | G | B | G | B | G | B | G | B | G | B |
| R07 | R | W | R | W | R | W | R | W | R | W | R | W |
| R08 | G | B | G | B | G | B | G | B | G | B | G | B |
| R09 | R | W | R | W | R | W | R | W | R | W | R | W |
| R10 | G | B | G | B | G | B | G | B | G | B | G | B |
| R11 | R | W | R | W | R | W | R | W | R | W | R | W |
| R12 | G | B | G | B | G | B | G | B | G | B | G | B |

FIG. 14D

|     | C01 | C02 | C03 | C04 | C05 | C06 | C07 | C08 | C09 | C10 | C11 | C12 |
|-----|-----|-----|-----|-----|-----|-----|-----|-----|-----|-----|-----|-----|
| R01 | W | R | W | G | W | R | W | G | W | R | W | G |
| R02 | B | W | G | W | B | W | G | W | B | W | G | W |
| R03 | W | G | W | R | W | G | W | R | W | G | W | R |
| R04 | G | W | B | W | G | W | B | W | G | W | B | W |
| R05 | W | R | W | G | W | R | W | G | W | R | W | G |
| R06 | B | W | G | W | B | W | G | W | B | W | G | W |
| R07 | W | G | W | R | W | G | W | R | W | G | W | R |
| R08 | G | W | B | W | G | W | B | W | G | W | B | W |
| R09 | W | R | W | G | W | R | W | G | W | R | W | G |
| R10 | B | W | G | W | B | W | G | W | B | W | G | W |
| R11 | W | G | W | R | W | G | W | R | W | G | W | R |
| R12 | G | W | B | W | G | W | B | W | G | W | B | W |

FIG. 14E

|     | C01 | C02 | C03 | C04 | C05 | C06 | C07 | C08 | C09 | C10 | C11 | C12 |
|-----|-----|-----|-----|-----|-----|-----|-----|-----|-----|-----|-----|-----|
| R01 | W | G | W | G | W | G | W | G | W | G | W | G |
| R02 | R | W | B | W | R | W | B | W | R | W | B | W |
| R03 | W | G | W | G | W | G | W | G | W | G | W | G |
| R04 | B | W | R | W | B | W | R | W | B | W | R | W |
| R05 | W | G | W | G | W | G | W | G | W | G | W | G |
| R06 | R | W | B | W | R | W | B | W | R | W | B | W |
| R07 | W | G | W | G | W | G | W | G | W | G | W | G |
| R08 | B | W | R | W | B | W | R | W | B | W | R | W |
| R09 | W | G | W | G | W | G | W | G | W | G | W | G |
| R10 | R | W | B | W | R | W | B | W | R | W | B | W |
| R11 | W | G | W | G | W | G | W | G | W | G | W | G |
| R12 | B | W | R | W | B | W | R | W | B | W | R | W |

FIG. 14F

|     | C01 | C02 | C03 | C04 | C05 | C06 | C07 | C08 | C09 | C10 | C11 | C12 |
|-----|-----|-----|-----|-----|-----|-----|-----|-----|-----|-----|-----|-----|
| R01 | R | G | B | G | R | G | B | G | R | G | B | G |
| R02 | W | G | W | G | W | G | W | G | W | G | W | G |
| R03 | B | G | R | G | B | G | R | G | B | G | R | G |
| R04 | W | G | W | G | W | G | W | G | W | G | W | G |
| R05 | R | G | B | G | R | G | B | G | R | G | B | G |
| R06 | W | G | W | G | W | G | W | G | W | G | W | G |
| R07 | B | G | R | G | B | G | R | G | B | G | R | G |
| R08 | W | G | W | G | W | G | W | G | W | G | W | G |
| R09 | R | G | B | G | R | G | B | G | R | G | B | G |
| R10 | W | G | W | G | W | G | W | G | W | G | W | G |
| R11 | B | G | R | G | B | G | R | G | B | G | R | G |
| R12 | W | G | W | G | W | G | W | G | W | G | W | G |

FIG. 14G

|     | C01 | C02 | C03 | C04 | C05 | C06 | C07 | C08 | C09 | C10 | C11 | C12 |
|-----|-----|-----|-----|-----|-----|-----|-----|-----|-----|-----|-----|-----|
| R01 | W | G | B | G | R | G | W | G | R | G | B | G |
| R02 | G | G | G | G | G | G | G | G | G | G | G | G |
| R03 | B | G | W | G | B | G | R | G | W | G | R | G |
| R04 | G | G | G | G | G | G | G | G | G | G | G | G |
| R05 | R | G | B | G | W | G | B | G | R | G | W | G |
| R06 | G | G | G | G | G | G | G | G | G | G | G | G |
| R07 | W | G | R | G | B | G | W | G | B | G | R | G |
| R08 | G | G | G | G | G | G | G | G | G | G | G | G |
| R09 | R | G | W | G | R | G | B | G | W | G | B | G |
| R10 | G | G | G | G | G | G | G | G | G | G | G | G |
| R11 | B | G | R | G | W | G | R | G | B | G | W | G |
| R12 | G | G | G | G | G | G | G | G | G | G | G | G |

FIG. 14H

|     | C01 | C02 | C03 | C04 | C05 | C06 | C07 | C08 | C09 | C10 | C11 | C12 |
|-----|-----|-----|-----|-----|-----|-----|-----|-----|-----|-----|-----|-----|
| R01 | R | G | B | G | R | G | B | G | R | G | B | G |
| R02 | G | W | G | W | G | W | G | W | G | W | G | W |
| R03 | B | G | R | G | B | G | R | G | B | G | R | G |
| R04 | G | W | G | W | G | W | G | W | G | W | G | W |
| R05 | R | G | B | G | R | G | B | G | R | G | B | G |
| R06 | G | W | G | W | G | W | G | W | G | W | G | W |
| R07 | B | G | R | G | B | G | R | G | B | G | R | G |
| R08 | G | W | G | W | G | W | G | W | G | W | G | W |
| R09 | R | G | B | G | R | G | B | G | R | G | B | G |
| R10 | G | W | G | W | G | W | G | W | G | W | G | W |
| R11 | B | G | R | G | B | G | R | G | B | G | R | G |
| R12 | G | W | G | W | G | W | G | W | G | W | G | W |

FIG. 14I

|     | C01 | C02 | C03 | C04 | C05 | C06 | C07 | C08 | C09 | C10 | C11 | C12 |
|-----|-----|-----|-----|-----|-----|-----|-----|-----|-----|-----|-----|-----|
| R01 | W | G | B | G | W | G | B | G | W | G | B | G |
| R02 | G | G | G | G | G | G | G | G | G | G | G | G |
| R03 | W | G | R | G | W | G | R | G | W | G | R | G |
| R04 | G | G | G | G | G | G | G | G | G | G | G | G |
| R05 | W | G | B | G | W | G | B | G | W | G | B | G |
| R06 | G | G | G | G | G | G | G | G | G | G | G | G |
| R07 | W | G | R | G | W | G | R | G | W | G | R | G |
| R08 | G | G | G | G | G | G | G | G | G | G | G | G |
| R09 | W | G | B | G | W | G | B | G | W | G | B | G |
| R10 | G | G | G | G | G | G | G | G | G | G | G | G |
| R11 | W | G | R | G | W | G | R | G | W | G | R | G |
| R12 | G | G | G | G | G | G | G | G | G | G | G | G |

LIGHT TRANSMISSION MEMBER, IMAGE PICKUP DEVICE, AND METHOD OF MANUFACTURING SAME

BACKGROUND OF THE INVENTION

1. Field of the Invention

The present invention relates to a light transmission member including a light transmission portion with narrow-band light transmission properties and a light transmission portion with wide-band light transmission properties.

2. Description of the Related Art

Regarding related art of image pickup devices such as CCD image sensors, CMOS image sensors, and so forth, light transmission members with light transmission portions that filter the primary colors of red, green, blue, and so forth (color filters) arranged via the Bayer method or the like (color filter arrays) have been used. With the recent aim to add functionality and improve performance of image pickup devices, in addition to light transmission portions that filter the primary colors, research is being done on the applicability of light transmission portions that filter auxiliary color and white color. These light transmission portions that filter auxiliary color and white color have light transmission properties in which their wavelength bands are wider than light transmission portions that filter the primary colors (wide-band light transmission properties). That is to say, the light transmission portions that filter the primary colors have light transmission properties in which their wavelength bands are narrower than light transmission portions that filter auxiliary color and white color (narrow-band light transmission properties). Japanese Patent application Laid-Open No. 2009-130575 discloses a light transmission portion that filters white color with the objective of detecting luminance components. Japanese Patent application Laid-Open No. 2011-243817 discloses light transmission portions that filter white color with the objective of expanding dynamic range. Japanese Patent applications Laid-Open Nos. 2010-020055 and 2010-147143 disclose light transmission portions that filter white color with the objective of focus detection. Japanese Patent application Laid-Open No. 2010-147143 proposes technologies to resolve issues with degradation of image quality caused by the configuration of a light transmission portion R that filters red color adjacent to a light transmission portion W that filters white color.

However, according to Japanese Patent application Laid-Open No. 2010-147143, there has not been adequate consideration with regard to the configuring of a light transmission portion G that filters green color adjacent to a light transmission portion W, and the configuring of the light transmission portion W adjacent to the light transmission portion R, and the light transmission portion W adjacent to the light transmission portion G.

Regarding light transmission members, if a light transmission portion that has wide-band light transmission properties and a light transmission portion that has narrow-band light transmission properties are adjacent, depending on the position and configuration of the two light transmission portions, they may interact with each other in a way that may lower optical properties of the light transmission members.

SUMMARY OF THE INVENTION

Provided is a method to form a light transmission member comprising: a series of processes to form light transmission portions, each of the processes including forming a light transmission film and leaving the light transmission film in any of a plurality of sections of a predetermined plane, and each of the processes being performed for each formation of each light transmission film having different light transmission properties, the plurality of sections of the predetermined plane including a first section, a second section, a third section, a fourth section, a fifth section, a sixth section, a seventh section, an eighth section, and a ninth section, regarding a first direction of the predetermined plane, the first section is between the second section and the third section, the second section and the third section are between the sixth and the seventh section, the second section is adjacent to the first section and sixth section, and the third section is adjacent to the first section and the seventh section, regarding a second direction that intersects the first direction of the predetermined plane, the first section is between the fourth section and the fifth section, the fourth section and the fifth section are between the eighth section and the ninth section, the fourth section is adjacent to the first section and the eighth section, and the fifth section is adjacent to the first section and the ninth section, wherein the light transmission portion disposed in the first section exhibits a green color, red color, and blue color light transmittance at or above a predetermined value, the light transmission portions disposed in each of the second section, the third section, the fourth section, and the fifth section exhibit at least one of a green color, red color, and blue color light transmittance at or above a predetermined value, and the light transmission portions disposed in each of the second section, the third section, the fourth section, and the fifth section exhibit at least one of a green color, red color, and blue color light transmittance below the predetermined value, and wherein, in the series of processes, after the light transmission portions are formed for the second section, the third section, the fourth section, and the fifth section, the light transmission portions are formed for the first section, the sixth section, the seventh section, the eighth section, and the ninth section.

According to the present technology, a light transmission member with superior optical properties may be supplied.

Further features of the present invention will become apparent from the following description of exemplary embodiments with reference to the attached drawings.

BRIEF DESCRIPTION OF THE DRAWINGS

FIGS. 5A through 5F are explanatory diagrams illustrating a first embodiment.

FIGS. 6A through 6I are explanatory diagrams illustrating the first embodiment.

FIGS. 7A through 7F are explanatory diagrams illustrating a reference embodiment.

FIGS. 9A through 9F are explanatory diagrams illustrating a second embodiment.

FIGS. 10A through 10F are explanatory diagrams illustrating a third embodiment.

FIGS. 11A through 11F are explanatory diagrams illustrating a fourth embodiment.

FIGS. 13A through 13H illustrate various Examples.

FIGS. 14A through 14I are explanatory diagrams illustrating more Examples.

DESCRIPTION OF THE EMBODIMENTS

Light Transmission Members and Image Pickup Device

Figure 1A:
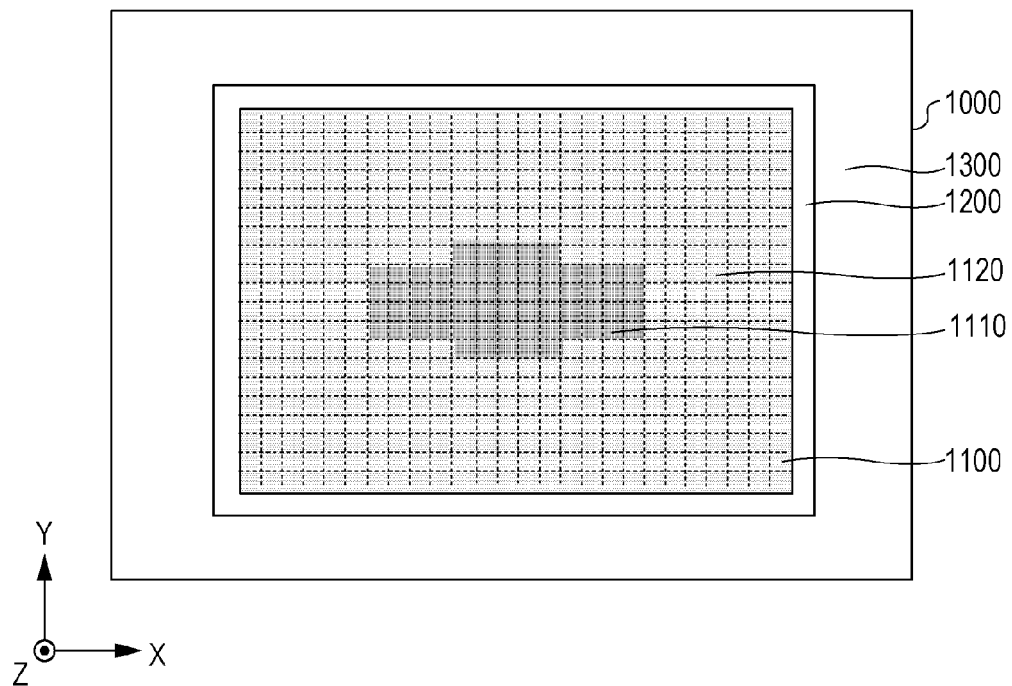
FIGS. 1A, 1B and 1C are schematic diagrams illustrating relevant parts in an example of an image pickup device.

An example of an image pickup device that includes light transmission members will be described with reference to FIGS. 1A through 2. FIG. 1A illustrates a CMOS image sensor as an image pickup device 1000. The image pickup device 1000 may have an image pickup region 1100, an auxiliary region 1200, and a peripheral region 1300. The image pickup region 1100 has light receiving pixels (effective pixels) that include a photoelectric conversion portion and a pixel circuit, which are arranged in a matrix. The auxiliary region 1200 may be provided with light-shielding pixels (OB pixels) that include a photoelectric conversion portion and a pixel circuit, and invalid pixels (NULL pixels) that include a pixel circuit but do not include a photoelectric conversion portion. The peripheral region 1300 may be provided with a signal processing circuit that performs signal processing such as AD conversion or noise canceling for signals from the pixel circuit, a driving circuit that drives the pixel circuit and signal processing circuit, and an electrode pad for external communication. The present technology is particularly related to the image pickup region 1100.

Figure 1B:
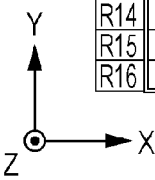
Figure 1C:
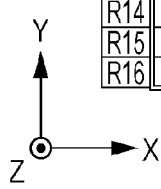

The image pickup region 1100 according to the present example includes a first image pickup section 1110 that includes a first pixel pattern, and a second image pickup region 1120 that includes a second pixel pattern. The first pixel pattern, which is 16 rows by 16 columns, of the first image pickup region 1110 is illustrated in FIG. 1B, and the second pixel pattern, which is 16 rows by 16 columns, of the second image pickup region 1120 is illustrated in FIG. 1C. The image pickup region 1100 is arranged with the first image pickup region 1110 is arranged in the center of the image pickup region 1100, and the second image pickup region 1120 is arranged around the first image pickup region 1110. For convenience, the 16 rows in FIGS. 1B and 1C are labeled R01 through R16, and the 16 columns are labeled C01 through C16, respectively.

Figure 2:
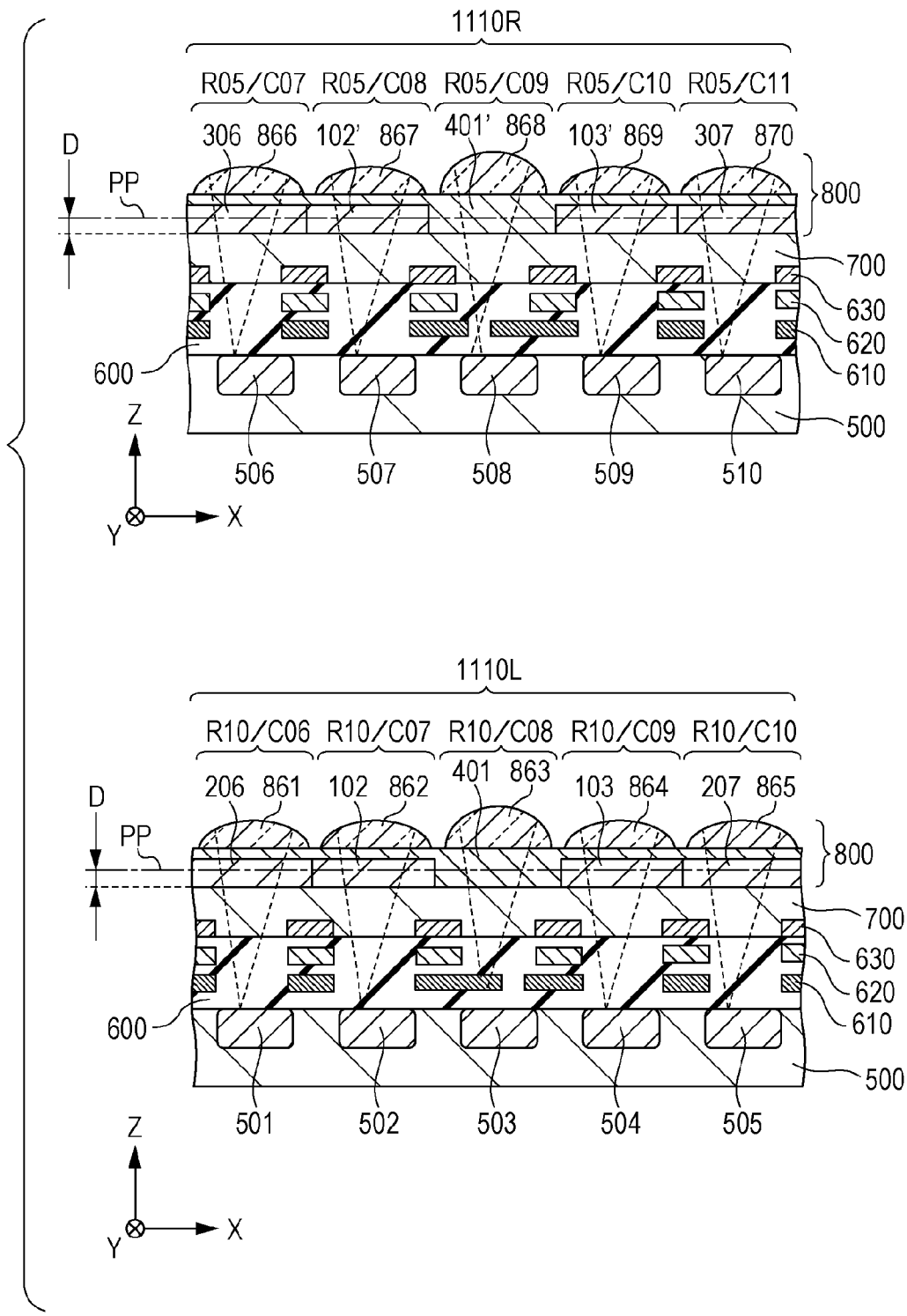
FIG. 2 is a schematic diagram illustrating sectional views in an example of the image pickup device.

FIG. 2 illustrates two cross-sectional diagrams, an X-Z cross-sectional diagram of the pixel group 1110R formed from the five pixels R05/C07 through C11, and an X-Z cross-sectional diagram of the pixel group 1110L formed from the 5 pixels R10/C06 through C10. The image pickup device 1000 includes a semiconductor substrate 500 which includes multiple photoelectric conversion portions 501, 502, 503, 504, 505, 506, 507, 508, 509, and 510. The surface of the semiconductor substrate 500 is provided with multiple metal layers which include a first metal layer 610, a second metal layer 620, and a third metal layer 630; and an insulating layer 600. The insulating layer 600, which is formed of an interlayer insulating layer, is provided between the first metal layer 610 and the semiconductor substrate 500, and between each metal layer. An intermediate layer 700 that includes a passivation layer and/or a planarizing layer is configured on the surface of the insulating layer 600. A light transmission member 800 is configured on the surface of the intermediate layer 700 substrate. Furthermore, the substrate does not have to be the intermediate layer 700, it may also be the semiconductor substrate 500 or the insulating layer 600, or the substrate may include other members not illustrated. Regarding the pixel group 1110L, the light transmission member 800 includes multiple light transmission portions 206, 102, 401, 103, and 207, and regarding the pixel group 1110R, the light transmission member 800 includes multiple light transmission portions 306, 102', 401', 103', and 307. These multiple light transmission portions are positioned within a predetermined plane PP, which is ideally a flat surface that has a position separated from the surface of the intermediate film 700 at a predetermined distance D; and regarding the image pickup region 1100, the multiple light transmission portions are arranged in a two-dimensional state along the image pickup surface. Also, the light transmission member 800 is configured on each of the light transmission portions 206, 102, 401, 103, 207, 306, 102', 401', 103', and 307; and includes multiple focus portions 861, 862, 863, 864, 865, 866, 867, 868, 869, and 870. Each of the multiple focus portions is a microlens. The multiple photoelectric conversion portions 501, 502, 503, 504, 505, 506, 507, 508, 509, and 510; the multiple light transmission portions 206, 102, 401, 103, 207, 306, 102', 401', 103', and 307; and the multiple focus portions 861, 862, 863, 864, 865, 866, 867, 868, 869, and 870 have correlating relationships and thus configure the pixels.

Figure 3:
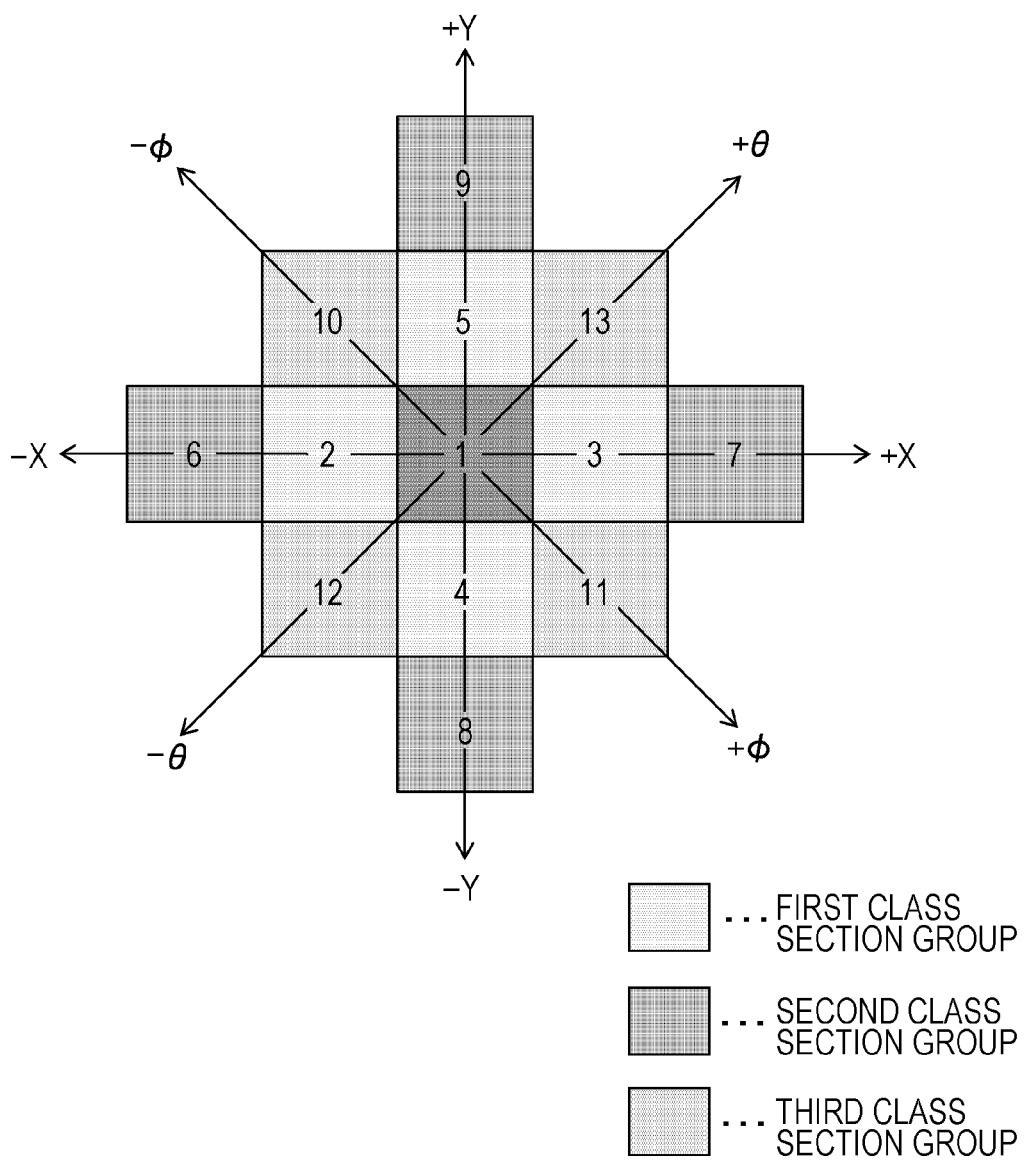
FIG. 3 is a diagram illustrating an example of distribution of light transmission properties.

For the purpose of discussion, the predetermined plane PP is divided into multiple sections. FIG. 3 illustrates the multiple sections, which include a first section 1, a second section 2, a third section 3, a fourth section 4, a fifth section 5, a sixth section 6, a seventh section 7, an eighth section 8, a ninth section 9, a tenth section 10, and eleventh section 11, a twelfth section 12, and a thirteenth section 13. The shape of each section in the present example is square, but at least any of the sections may be hexagonal or octagonal, and each section may also have a different shape.

For the purpose of describing the positional relationship of the multiple sections, the predetermined plane PP contains an X axis, a Y axis, an $\phi$ axis, and a $\theta$ axis. The X axis, the Y axis, the $\phi$ axis, and the $\theta$ axis all intersect each other. As is typical, the X axis and the Y axis bisect, and the $\phi$ axis and the $\theta$ axis bisect in the present example, however there is no restriction on these angles, the X axis and the Y axis may, for example, form a 60-degree angle. Also as is typical, the X axis and the $\phi$ axis, the Y axis and the $\phi$ axis, the X axis and the $\theta$ axis, and the Y axis and the $\theta$ axis all form 45 degree angles in the present example, however they may also form other angles not limited to 45 degrees. In the present example, multiple horizontal output lines (not illustrated) are configured along the X axis, and multiple vertical output lines (not illustrated) are configured along the Y axis. However, there may be multiple horizontal scan lines that intersect the X axis and the Y axis along the $\phi$ axis, for example, and there may be multiple horizontal scan lines that intersect the X axis and the Y axis along the $\theta$ axis, for example.

On the X axis, the first section 1 is between the second section 2 and the third section 3. On the X axis, the second section 2 and the third section 3 are between the sixth section 6 and the seventh section 7. The second section 2 is adjacent to the first section 1 and the sixth section 6. The third section 3 is adjacent to the first section 1 and the seventh section 7. Thus, the sixth section 6, the second section 2, the first section 1, the third section 3, and the seventh section 7 continue in this sequence following from the negative X side to the positive X side of the X axis.

On the Y axis, the first section 1 is between the fourth section 4 and the fifth section 5. On the Y axis, the fourth section 4 and the fifth section 5 are between the eighth section 8 and the ninth section 9. The fourth section 4 is adjacent to the first section 1 and the eighth section 8, and the fifth section is adjacent to the first section 1 and the ninth section 9. Thus, the eighth section 8, the fourth section 4, the first section 1, the fifth section 5, and the ninth section 9 continue in this sequence following from the negative Y side to the positive Y side of the Y axis.

On the φ axis, the first section 1 is between the tenth section 10 and the eleventh section 11. The tenth section 10 is adjacent to the second section 2 and the fifth section 5. The eleventh section 11 is adjacent to the third section 3 and the fourth section 4. Thus, the tenth section 10, the first section 1, and the eleventh section 11 continue in this sequence following from the negative φ side to the position φ side of the φ axis.

The space between the tenth section 10 and the eleventh section 11 is smaller than the space between the sixth section 6 and the seventh section 7, and the space between the eighth section 8 and the ninth section 9. In the present example, the space between the tenth section 10 and the eleventh section 11 is larger than the space between the second section 2 and the third section 3, and the space between the fourth section 4 and the fifth section 5. However, the space between the tenth section 10 and the eleventh section 11 may be less than at least either the space between second section 2 and the third section 3 or the space between the fourth section 4 and the fifth section 5.

Furthermore, in the present example, the tenth section 10 is adjacent to the first section 1 by a point, but may also be adjacent by an edge. If a portion of the second section 2 and the fifth section 5 is positioned between the tenth section 10 and the first section 1, the tenth section 10 does not have to be adjacent to the first section 1. The relationship between the eleventh section 11, the first section 1, the third section 3, and the fourth section 4 is the same.

On the θ axis, the first section 1 is between the twelfth section 12 and the thirteenth section 13. The twelfth section 12 is adjacent to the second section 2 and the fourth section 4. The thirteenth section 13 is adjacent to the third section 3 and the fifth section 5. Thus, the twelfth section 12, the first section 1, and the thirteenth section 13 continue in this sequence following from the negative θ side to the positive θ side of the θ axis.

The space between the twelfth section 12 and the thirteenth section 13 is smaller than the space between the sixth section 6 and the seventh section 7, and the space between the eighth section 8 and the ninth section 9. In the present example, the space between the twelfth section 12 and the thirteenth section 13 is larger than the space between the second section 2 and the third section 3, and the space between the fourth section 4 and the fifth section 5. However, the space between the twelfth section 12 and the thirteenth section 13 may be less than either the space between the second section 2 and the third section 3 or the space between the fourth section 4 and the fifth section 5.

Furthermore, in the present example, the twelfth section 12 is adjacent to the first section 1 by a point, but may also be adjacent by an edge. If a portion of the second section 2 and the fourth section 4 is positioned between the twelfth section 12 and the first section 1, the tenth section 10 does not have to be adjacent to the first section 1. The relationship between the thirteenth section 13, the first section 1, the third section 3, and the fifth section 5 is the same.

The group of sections that include the second section 2, the third section 3, the fourth section 4, and the fifth section 5 is denoted as "the first class section group." Each section in the first class section group is adjacent to the first section 1. The group of sections that include the sixth section 6, the seventh section 7, the eighth section 8, and the ninth section 9 is denoted as "the second class section group." Each section in the second class section group is adjacent to the first class section group, and is positioned on the opposite side of the first section 1 in relation to the first class section group. The group of sections that include the tenth section 10, the eleventh section 11, the twelfth section 12, and the thirteenth section 13 is denoted as "the third class section group." Each section in the third class section group is adjacent to the first class section group, and is positioned closer to the first section 1 than the second class section group. Particularly in the present embodiment, the first section 1 is essential to the first class section group and the second class section group.

The multiple light transmission portions 206, 102, 401, 103, 207, 306, 102', 401', 103', and 307 in the light transmission member 800 illustrated in FIG. 2 all have mutually different light transmission properties. Specifically, the light transmission portions 102, 103, 102', and 103' have a first light transmission property G. The light transmission portions 206 and 207 have a second light transmission property B. The light transmission portions 306 and 307 have a third light transmission property R. The light transmission portions 401 and 401' have a fourth light transmission property W. Regarding a typical image pickup device, the light transmission portions 102, 103, 102', and 103' that have the first light transmission property G; the light transmission portions 206 and 207 that have the second light transmission property B; the light transmission portions 306 and 307 that have the third light transmission property R; and are all color filters. Regarding a typical image pickup device, the light transmission member 800 includes a color filter array. Furthermore, G, B, R, and W illustrated in FIGS. 1B and 1C exhibit the light transmission property of light transmission portions for each pixel on the predetermined plane PP, which is an ideal flat area positioned from the surface of the intermediate film 700 at the predetermined distance D illustrated in FIG. 2. In the following descriptions, the light transmission portions 401 and 401' positioned in the first section 1 are described as having the fourth light transmission property W. For example, the light transmission portion 401 for the pixel R10/C08 as shown in FIG. 1B is positioned in the first section 1, and so the light transmission portions for the pixels R10/C07, R10/C09, R09/C08, and R11/C08 are positioned in the first class section group. Also, the light transmission portions for the pixels R10/C06, R10/C10, R08/C08, and R12/C08 are positioned in the second class section group. Also, the light transmission portions for the pixels R09/C07, R09/C09, R11/C07, and R11/C09 are positioned in the third class section group.

Figure 4:
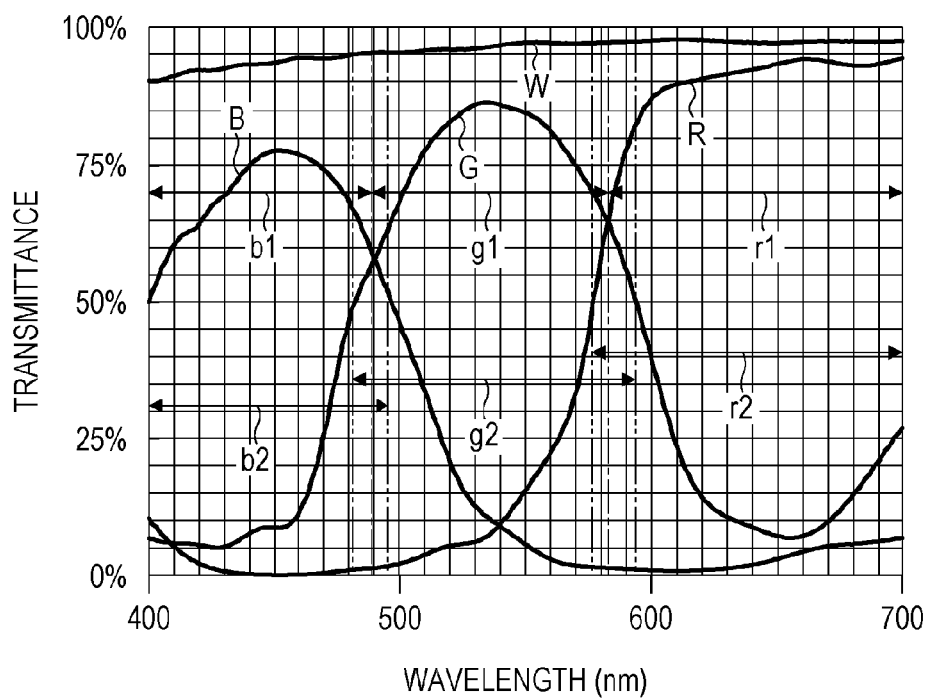
FIG. 4 is an explanatory diagram illustrating the multiple sections.

FIG. 4 illustrates an example of spectral transmittance for the first light transmission property G, the second light transmission property B, the third light transmission property R, and the fourth light transmission property W. Here, the first light transmission property G, the second light transmission property B, and the third light transmission property R are given a generic term of the narrow-band light transmission property, and the fourth light transmission property W is said to be a wide-band light transmission property. Each narrow-band light transmission property has a wavelength band that exhibits a transmittance higher than the other narrow-band light transmission properties, and this wavelength band is called the "relative transmission wavelength band." Each narrow-band light transmission property has a wavelength band that exhibits a transmittance lower than the other narrow-band light transmission properties, and this wavelength band is called the "relative non-transmission wavelength band." For example, the light transmission portion that has the first light transmission property G has a wavelength band g1, which is this property's relative transmission wavelength band that exhibits a transmittance higher than that of the light transmission portion that has the second light transmission property B or the light transmission portion that has the third light transmission property R. The light transmission portion that has the first light transmission property G has a wavelength band b1, which is this property's relative non-transmission wavelength band that exhibits a transmittance lower than that of the light transmission portion that has the second light transmission property B. The light transmission portion that has the first light transmission property G has a wavelength band r1, which is this property's relative non-transmission wavelength band that exhibits a transmittance lower than that of the light transmission portion that has the third light transmission property R. The wavelength band b1, which is the relative transmission wavelength band for the second light transmission property B, and the wavelength bands g1 and r1, which are the relative non-transmission wavelength bands for the second light transmission property B are the same. The wavelength band r1, which is the relative transmission wavelength band for the third light transmission property R, and the wavelength bands g1 and b1, which are the relative non-transmission wavelength bands for the third light transmission property R are the same.

Also, each narrow-band light transmission property has a wavelength band that exhibits a transmittance over a predetermined value, and this wavelength band is called the "absolute transmission wavelength band." Each narrow-band light transmission property has a wavelength band that exhibits a transmittance under the predetermined value, and this wavelength is called the "absolute non-transmission wavelength band." The predetermined value may be at or above 25%, but the predetermined value is more practically set at or above 50%. FIG. 4 illustrates the wavelength band g2, which is the absolute transmission wavelength band for the first light transmission property G, the wavelength band b2, which is the absolute transmission wavelength band for the second light transmission property B, and the wavelength band r2, which is the absolute transmission wavelength band for the third light transmission property R when the predetermined value is set to 50%. As may be understood from FIG. 4, the relative transmission property for each light transmission property R, G, and B do not overlap each other, but the absolute transmission wavelength bands may overlap. The predetermined value should be set so that the absolute transmission wavelength band is smaller than the relative transmission wavelength band. For example, regarding the light transmission properties R, G, and B in FIG. 4, if the predetermined value is set to 75%, the absolute transmission wavelength band for each light transmission property would be smaller than the relative transmission wavelength band for each light transmission property.

In the present example, the light transmission portions 206, 102, 103, 207, 306, 102', 103', and 307 that have narrow-band light transmission properties are color filters for primary color light transmission. Thus, the light transmission portions are configured such that each of the first light transmission property G, the second light transmission property B, and the third light transmission property G only have one wavelength band where the relative transmission wavelength band and the absolute transmission wavelength band are continuous. Specifically, the relative transmission wavelength band g1 and the absolute transmission wavelength band g2 for the first light transmission property G are in the green wavelength band, and not in either the blue wavelength band or the red wavelength band. The relative transmission wavelength band b1 and the absolute transmission wavelength band b2 for the second light transmission property B are in the blue wavelength band, and not in either the green wavelength band or the red wavelength band. The relative transmission wavelength band r1 and the absolute transmission wavelength band r2 for the third light transmission property R are in the red wavelength band, and not in either the green or the blue wavelength bands.

However, the light transmission portions 206, 102, 103, 207, 306, 102', 103', and 307 are not limited to being color filters for primary color transmission. For example, any of the light transmission portions may be color filters for auxiliary color transmission with regard to the primary colors, such as blue-green (cyan), red-violet (magenta), yellow, or similar. In this case, the light transmission property of each light transmission portion may have multiple wavelength bands where the relative transmission wavelength band and/or the absolute transmission wavelength band are separated from each other. Also, the light transmission portion that has the narrow-band light transmission property may have both a light transmission portion that is a color filter for primary color transmission and a light transmission portion that is a color filter for auxiliary color transmission.

At least one light transmission portion positioned in all sections of the first class section group should have one of these different narrow-band light transmission properties. In the example illustrated in FIG. 1B, the light transmission portion positioned in all sections of the first class section group has the first light transmission property G. Furthermore, the light transmission portion positioned in all sections of the first class section group may have different narrow-band light transmission properties from each other. Also, the light transmission portions positioned in the second class section group and the third class section group may have narrow-band light transmission properties, or may have wide-band light transmission properties.

As described above, the light transmission property (wide-band light transmission property) of the light transmission portions 401 and 401' positioned in the first section 1, which has been described as the fourth light transmission property W, satisfies the following Condition (1) and Condition (2).

Condition (1): The fourth light transmission property W exhibits a transmittance at or above a predetermined value regarding at least a portion of the absolute transmission wavelength band of the light transmission property for the light transmission portion positioned in each and every section of the first class section group.

Condition (2): The fourth light transmission property W exhibits a transmittance at or above a predetermined value regarding at least a portion of the absolute non-transmission wavelength band of the light transmission property for the light transmission portion positioned in each and every section of the first class section group.

For example, when the light transmission portion positioned in all sections of the first class section group has the first light transmission property G, the fourth light transmission property W exhibits a transmittance at or above the predetermined value regarding the wavelength band g2, which is the absolute transmission wavelength band for the first light transmission property G, and so Condition (1) is satisfied. Additionally, the fourth light transmission property W exhibits a transmittance at or above the predetermined value regarding at least one of the wavelength bands r2 and b2, which are the absolute transmission wavelength bands for the first light transmission property G, and so Condition (2) is satisfied. As in the present example, the fourth light transmission property W preferably exhibits a transmittance at or above the predetermined value regarding the absolute transmission wavelength band and the absolute non-transmission wavelength band for all bands.

All of the light transmission portions positioned in all sections of the first class section group do not have to have the same light transmission property. The case where the light transmission portions positioned in some of the sections in the first class section group have the first light transmission property G, and the light transmission portions positioned in the other sections of the first class section group have the second light transmission property B will be described below. The fourth light transmission property W exhibits a transmittance at or above the predetermined value regarding the wavelength band g2, which is the absolute transmission wavelength band for the first light transmission property G, and also the fourth light transmission property W exhibits a transmittance at or above the predetermined value regarding wavelength band b2, which is the absolute transmission wavelength band for the second light transmission property B, and so Condition (1) is satisfied. Additionally, the fourth light transmission property W exhibits a transmittance at or above the predetermined value regarding the wavelength band r2, which is the absolute non-transmission wavelength band for the first light transmission property G, and is also the absolute non-transmission wavelength band for the second light transmission property B, and so Condition (2) is satisfied.

It is preferable that the light transmission property (wide-band light transmission property) for the light transmission portions 401 and 401' positioned in the first section 1 also satisfies a Condition (3).

Condition (3): The fourth light transmission property W exhibits a transmittance higher than the maximum transmittance of the transmission portions positioned in each and every section in the first class section group, regarding the absolute transmission wavelength band of the light transmission property for the light transmission portions positioned in each and every section in the first class section group.

In the example in FIG. 4, regarding the wavelength band g2, which is the absolute transmission wavelength band for the first light transmission property G, the transmittance of the fourth light transmission property W is at or above 50%, and further exhibits a transmittance (95% or higher) higher than the transmittance of the first light transmission property G (86%). Regarding the wavelength band b2, which is the absolute transmission wavelength band for the second light transmission property B, the transmittance of the fourth light transmission property W is at or above 50%, and further exhibits a transmittance (90% or higher) higher than the transmittance of the second light transmission property B (78%). Regarding the wavelength band r2, which is the absolute transmission wavelength band for the third light transmission property R, the transmittance of the fourth light transmission property W is at or above 50%, and further exhibits a transmittance (95% or higher) higher than the transmittance of the third light transmission property R (94%). Thus, the light transmission portion that has the fourth light transmission property W typically is configured from white color transmission materials.

The light transmission portions positioned in the first section 1 are not limited to being configured from white color transmission materials. When all light transmission portions positioned in all sections of the first class section group are color filters for green color light transmission, Condition (1) and Condition (2) are still satisfied if the light transmission portions positioned in the first section 1 are color filters for yellow color light transmission or blue-green color light transmission. Also, when all light transmission portions positioned in all sections of the first class section group are color filters for green color light transmission and color filters for blue light transmission, Condition (1) and Condition (2) are still satisfied if the light transmission portions positioned in the first section 1 are color filters for red-violet color light transmission. Furthermore, when color filters for red color light transmission, color filters for green light transmission, and color filters for blue light transmission are positioned in the first class section group, white color transmission materials may be used as the light transmission portions positioned in the first section 1. When color filters for auxiliary color light transmission with regard to the primary colors are positioned in the first class section group, white color transmission materials may also be used as the light transmission portions positioned in the first section 1.

Focus detection of the image pickup surface may be performed with the image pickup device illustrated in FIGS. 1A through 1C. The first image pickup region 1110 includes image pickup pixels configured with light transmission portions that have narrow-band light transmission properties (R, G, B), and includes focus detection pixels configured with light transmission portions that have the wide-band light transmission property (W). The first image pickup region 1120 includes only the image pickup pixels, and so does not include the focus detection pixels. Furthermore, the focus detection pixels are not limited to being unevenly arranged in a portion of the image pickup region 1100 as in the present example, an implementation may be used where the focus detection pixels are unevenly arranged over the image pickup region 1100 entirely. Also, the focus detection pixels may also have dual functions acting also as image pickup pixels.

In the present example, pixels at R05/C09 (fifth row, ninth column) and at R10/C08 (tenth row, eighth column) are focus detection pixels, and these two detection pixels perform focus detection as a pair. Additionally, in FIG. 1B, the pixels at R03/C03 and R06/C02 form a pair of focus detection pixels, the pixels at R03/C15 and R06/C14 for a pair of focus detection pixels, and the pixels at R15/C03 and R12/C14 form a pair of focus detection pixels.

As illustrated in FIG. 2, for the focus detection pixel at R05/C09, a portion of the first metal layer 710 shades a portion of the photoelectric conversion portion 503. Incident light to the focus detection pixel at R05/C09 is capable of being input to only the left-half side of the photoelectric conversion portion 503 on the surface of the diagram through a slit in the first metal layer 610. As illustrated in FIG. 2, for the focus detection pixel at R10/C08, a portion of the first metal layer 610 shields a portion of the photoelectric conversion portion 513. Incident light to the focus detection pixel at R10/C08 of FIG. 2 is capable of being input to only the right-half side of the photoelectric conversion portion 508 on the surface of the diagram through a slit in the first metal layer 610. According to such a configuration, as with the light rays illustrated in FIG. 2, light input diagonally from the upper right of the diagram surface is detected by the focus detection pixel at R05/C09. Though not illustrated in FIG. 2, light rays input diagonally from the upper left of the diagram surface are detected by the focus detection pixel at R10/C08. By comparing signals from the pair of focus detection pixels at R05/C09 and at R10/C08, the focus state of the image photographed at the image pickup region 1100 may be determined. Furthermore, as illustrated in FIG. 2, the focus distance for focus portions 863 and 868 of the focus detection pixels is shorter than other focus portions, or rather, it is preferable that the focus of focus portions 863 and 868 is closer to the predetermined plane PP than that of other focus portions. In the present example, focus portions 863 and 868 have a curvature larger than other focus portions, and also are thicker, but an arrangement may be made wherein only one of these may be larger. The focus portion of an image pickup pixel has a focal point on the photoelectric conversion portion side of the first metal layer 610, and the focus portion of a focus detection pixel has a focal point on a position that is farther from the photoelectric conversion portion than the focus portion of an image pickup pixel, which in the present example is at the height of the first metal layer 610. As a result, the precision of focus detection may be improved. In the present example, a pair of two focus detection pixels has been used to describe focus detection, but a photoelectric conversion portion of a focus detection pixel may be configured to include multiple photoelectric conversion regions electrically divided using diffusion separation or insulator separation. In this case, by comparing signals based on signal charges photoelectrically converted at each of the multiple photoelectric conversion regions, focus detection may be performed with one focus detection pixel.

Furthermore, the pixels configured in the light transmission portions that have the wide-band light transmission property do not have to be focus detection pixels; simple image pickup pixels, photometric pixels, or pixels that improve dynamic range may also be used.

Forming Method of Light Transmission Members

The forming method of light transmission members may be broadly divided into a pre-process, a main process, and a post-process. The pre-process is a process that prepares the substrate for the main process. The main process is a process to form the light emission portions in each of the multiple sections. The post-process is a process to form the multiple focus portions. The post-process may be omitted.

According to the present embodiment, the forming method of the light transmission members involves forming light transmission members that have at least two light transmission properties in the first section 1, the first class section group, and the second class section group, which is performed at the main process. Light transmission portions that have the fourth light transmission property W are formed in the first section 1, and light transmission portions that have light transmission properties selected from the first light transmission property G, the second light transmission property B, and the third light transmission property R are formed in each every section in the first class section group.

The light transmission portions that have a predetermined light transmission property are formed by a forming process that includes a film forming stage. At the film forming stage, a light transmission film that has a predetermined light transmission property is formed on the substrate. The light transmission film formed at the film forming stage has a thickness larger than a predetermined distance D. The light transmission film formed at the film forming stage is formed for all of the multiple sections. Specifically, for each and every multiple section, the light transmission film is formed to either be positioned in one of the sections, or instead of being positioned in one of the sections, is positioned above the section. As light transmission portions that have at least two light transmission properties in the first section 1, the first class section group, and the second class section group, the forming method of light transmission members includes multiple forming processes that include the film forming stage to form light transmission films on the substrate in which each has a different light transmission property. The multiple forming processes include multiple types in accordance with the light transmission property of the light transmission portion as the result of corresponding forming process. The multiple forming processes include multiple classes in accordance with the position of the light transmission portion as the result of corresponding forming process. The order of the multiple forming processes may preferably be decided with regard to the class and/or type of the forming process. This sequence of multiple forming processes is the main process. Furthermore, the multiple forming processes may include two film forming stages to form light transmission films with the same light transmission property on the substrate. The number of multiple processes is represented by n, and the initial forming process in the sequence of multiple processes is denoted as the first order process, and the process after the first order process is denoted as the second order process, and the last of the multiple forming processes is denoted as the nth order process.

At the film forming stage for each forming process, the film forming method to form films for all of the multiple sections is selected, which is either a liquid phase film formation or a solid phase film formation. The liquid phase film formation may use such coating methods as spin coating, dipping, or spraying. The solid phase film formation may use sputtering, vapor deposition, or similar. Furthermore, the film forming method may be changed for each forming process. Spin coating is particularly practical, and is the preferable method to use. Among liquid phase film formations, there are also an inkjet method and a screen printing method, but it is preferable to avoid these methods as it possible that a light transmission film may not form in some of the multiple sections.

When desirable, a patterning stage may be included in each of the multiple processes, in which patterning is performed to remove a portion of the light transmission film formed during the forming process. At the patterning stage, patterning of the light transmission film is accomplished by using a resist mask to perform etching of the light transmission film. By using a light transmission film that has photosensitive properties, patterning of the light transmission film may also be accomplished by keeping the light transmission film under exposure using a photo mask until it has developed. This second method is preferable for simplifying the formation of the light transmission members. For those forming process within the multiple processes that do not have a patterning stage, the light transmission film does not have to have photosensitive properties.

Within the multiple forming processes, all forming processes that include a patterning stage which leaves the film in the first class section group are denoted as "the first class processes." There may be cases where there is only one forming process in the first class processes, as well as cases where there are two or more forming processes in the first class processes.

Within the multiple forming processes, all forming processes that include the patterning stage which leaves the film in the second class section group are denoted as "the second class processes." There may be cases where there is only one forming process in the second class processes, as well as cases where there are two or more forming processes in the second class processes.

Within the multiple forming processes, all forming processes that include the patterning stage which leaves the film in the third section group are denoted as "the third class processes." There may be cases where there is only one forming process in the third class processes, as well as cases where there are two or more forming processes in the third class processes.

Within the multiple forming processes, the forming stage where a film that has the fourth light transmission property W is formed in the first section 1 is denoted as "the fourth class process."

Regarding the forming method of the light transmission members, the forming method should satisfy at least the following Conditions (i) and (ii). By satisfying Condition (i) and Condition (ii), a light transmission member 800 that has superior optical properties may be formed.

Condition (i): The second class processes are performed after the first class processes Condition (ii): The fourth class processes are performed after the first class processes Satisfying Condition (i) and Condition (ii) enables the configuration of a proper sequence of the first class processes, the second class processes, the third class processes, and the fourth class processes as appropriate. Also, satisfying Condition (i) and Condition (ii) enables two or more processes from the second class processes, the third class processes, and the fourth class processes to be performed simultaneously, and enables the first class processes and the third class processes to be performed simultaneously.

Within the multiple forming processes, all forming processes include the patterning stage to remove the portion of the light transmission film positioned in the first section 1, which is formed at each forming process, at the latest before the fourth class processes. This is so that the portion of the light transmission film for the first section 1 formed at the fourth class processes is arranged in the first section 1.

Also, it is preferable to employ forming methods that satisfy the following Condition (iii) for each embodiment. Satisfying Condition (iii) enables the forming of the light transmission member 800 that has superior optical properties. This helps to remove any effect of the forming of the light transmission portion formed at the first class processes on the forming of the light transmission portion formed at the third class processes.

Condition (iii): The third class processes are performed after the first class processes Also, it is preferable to employ forming processes that satisfy the following Condition (iv). Satisfying Condition (iv) enables the forming of the light transmission member 800 that has superior optical properties. This helps to remove any effect of the forming of the light transmission portion formed at the fourth class processes on the forming of the light transmission portion formed at the third class processes.

Condition (iv): The fourth class processes are performed after the third class processes For each embodiment, it is preferable to employ forming processes that satisfy the following Condition (v). Satisfying Condition (v) enables the forming of the light transmission member 800 that has superior optical properties. This also simplifies the forming of the light transmission member 800.

Condition (v) The fourth class processes are performed last

When either or both of the second class processes and the third class processes are performed after the fourth class processes, the patterning stage is included in the fourth class processes to remove the light transmission film formed at the fourth class processes from the section where the light transmission film is left from the forming process to be performed after the fourth class processes. In contrast, when Condition (v) is satisfied, the fourth class of processes does not have to include the patterning stage to remove the light transmission film formed at the fourth class processes.

The sequence of the first class processes, the second class processes, the third class processes, and the fourth class processes may be combined, and the total possible combinations is 4!, which equals 24 combinations. Furthermore, the table of the 24 combinations below includes cases where two or more processes that normally are performed sequentially may be performed simultaneously. For example, the class of processes to be performed second and the class of processes to be performed third in the table may be performed simultaneously. In each row in the table of the 24 combinations, the letter "G" is used for each condition to indicate when Condition (i) or Condition (ii) is satisfied, and the letter "U" is used for each condition to indicate when Condition (i) and Condition (ii) are not satisfied. Also, for Condition (iii), Condition (iv), and Condition (v), the letter "G" is used to indicate when the condition is satisfied, and the letter "P" is used to indicate when the condition is not satisfied. In the judgment column, the letter "U" is used to indicate that at least one of the conditions Condition (i) and Condition (ii) are not satisfied. In the judgment column, the letter "P" or the letter "F" is used to indicate that at least one of the conditions Condition (iii) and Condition (iv) are not satisfied, and the letter "G" or the letter "E" is used to indicate that both are satisfied. For Condition (v), either the letter "F" or the letter "E" is used to indicate that the condition is satisfied. These symbols represent the level of superiority of the optical properties for the light transmission film in the order of lowest to highest, which is U (unacceptable), P (poor), F (fair), G (good), and E (excellent). The row names are included in the category of the present embodiment.

TABLE 1

| | Order | | | | Conditions | | | | | |
|---|---|---|---|---|---|---|---|---|---|---|
| Method | First | Second | Third | Fourth | (i) | (ii) | (iii) | (iv) | (v) | Judgment |
| (a) | First Class Process | Second Class Process | Third Class Process | Fourth Class Process | G | G | G | G | G | E |
| (b) | First Class Process | Third Class Process | Second Class Process | Fourth Class Process | G | G | G | G | G | E |
| (c) | First Class Process | Second Class Process | Fourth Class Process | Third Class Process | G | G | G | P | P | P |
| (d) | First Class Process | Third Class Process | Fourth Class Process | Second Class Process | G | G | G | G | P | G |
| (e) | First Class Process | Fourth Class Process | Second Class Process | Third Class Process | G | G | G | P | P | P |
| (f) | First Class Process | Fourth Class Process | Third Class Process | Second Class Process | G | G | G | P | P | P |
| (g) | Second Class Process | First Class Process | Third Class Process | Fourth Class Process | U | G | G | G | G | U |
| (h) | Third Class Process | First Class Process | Second Class Process | Fourth Class Process | G | G | P | G | G | F |
| (j) | Second Class Process | First Class Process | Fourth Class Process | Third Class Process | U | G | G | P | P | U |

TABLE 1-continued

| Method | Order | | | | Conditions | | | | | Judgment |
| --- | --- | --- | --- | --- | --- | --- | --- | --- | --- | --- |
| | First | Second | Third | Fourth | (i) | (ii) | (iii) | (iv) | (v) | |
| (k) | Third Class Process | First Class Process | Fourth Class Process | Second Class Process | G | G | P | G | P | P |
| (m) | Fourth Class Process | First Class Process | Second Class Process | Third Class Process | G | U | G | P | P | U |
| (n) | Fourth Class Process | First Class Process | Third Class Process | Second Class Process | G | U | G | P | P | U |
| (o) | Second Class Process | Third Class Process | First Class Process | Fourth Class Process | U | G | P | G | G | U |
| (p) | Third Class Process | Second Class Process | First class Process | Fourth Class Process | U | G | P | G | G | U |
| (q) | Second Class Process | Fourth Class Process | First class Process | Third Class Process | U | U | G | P | P | U |
| (r) | Third Class Process | Fourth Class Process | First class Process | Second Class Process | G | U | P | G | P | U |
| (s) | Fourth Class Process | Second Class Process | First class Process | Third Class Process | U | U | G | P | P | U |
| (t) | Fourth Class Process | Third Class Process | First class Process | Second Class Process | G | U | P | P | P | U |
| (u) | Second Class Process | Third Class Process | Fourth Class Process | First Class Process | U | U | P | G | P | U |
| (v) | Third Class Process | Second Class Process | Fourth Class Process | First Class Process | U | U | P | G | P | U |
| (w) | Second Class Process | Fourth Class Process | Third Class Process | First Class Process | U | U | P | P | P | U |
| (x) | Third Class Process | Fourth Class Process | Second Class Process | First Class Process | U | U | P | G | P | U |
| (y) | Fourth Class Process | Second Class Process | Third Class Process | First Class Process | U | U | P | P | P | U |
| (z) | Fourth Class Process | Third Class Process | Second Class Process | First Class Process | U | U | P | P | P | U |

The post-process forms the multiple focus portions. Focus portions include microlenses, which may be formed using such methods as reflow, etchback, gradation exposure, and imprinting. When desirable, a planarizing layer and a reflex suppression layer may be formed.

Manufacturing Method of Image Pickup Device

The manufacturing method of the image pickup device includes an element process to form semiconductor elements such as diodes and transistors, which configure multiple photoelectric conversion portions, pixel circuits, control circuits, and signal processing circuits on the semiconductor substrate. Known methods such as ion implantation may be used for the element process. This enables the formation of the semiconductor substrate 500 that has multiple photoelectric portions. Also, a wiring process is included to wire semiconductor elements such as diodes and transistors as desirable. Known methods may be used to form the insulating layer 600 that includes multiple metal layers 610 through 630 and multiple inter-layer insulating layers for the wiring process. Also, a process to form light transmission members is included. The light transmission members are formed using the methods to form light transmission members as described above. Typically, the process to form the light transmission members is performed after the element process and wiring process, but a portion of the wiring process may be performed after the formation of the light transmission members when desirable.

The following specifically describes embodiments regarding the method of forming the light transmission members.

First Embodiment

FIGS. 5A through 6I illustrate an example of a first embodiment when method (a) is employed. Furthermore, regarding FIGS. 5A through 5F, the reference numerals representing the sections with formed light transmission portions are enclosed in squares. FIGS. 6A through 6D are cross-sectional diagrams of the forming method of the light transmission members. Regarding FIGS. 6A through 6I, the lower tiers are cross-sectional diagrams of sections that include the sixth section 6, the second section 2, the first section 1, the third section 3, and the seventh section 7, as in the sequence from the negative X side to the positive X side of the X axis in FIG. 4. Regarding FIGS. 6A through 6I, the lower upper are cross-sectional diagrams of sections that include the tenth section 10, the fifth section 5, and the thirteenth section 13, as in the sequence from the negative X side to the positive X side of the X axis in FIG. 4.

Pre-process: A passivation layer made from silicon nitride is formed on the surface of the insulating layer 600, and a planarizing layer made from plastics is formed using spin coating. As a result, a flat intermediate layer 700 on the top surface is obtained. The etchback method may also be used to planarize. This enables the preparation of the intermediate film 700, which has a flat surface, as a substrate. FIGS. 5A and 6A illustrate the predetermined plane PP for each section before the forming of the light transmission member 800 on the intermediate film 700, as illustrated in FIG. 2.

The first order process: First, the film forming stage is performed to form the light transmission film 100, which has the first light transmission property G, on the surface of the intermediate film 700 (FIG. 6B). Next, the light transmission film 100 is left on the second section 2, the third section 3, the fourth section 4, and the fifth section 5 of the first class section group, and then the patterning stage is performed to remove the light transmission film 100 from all sections of the second class section group, all sections of the third class section group, and the first section 1 (FIG. 6C). This first order process results in the formation of the light transmission portions that have the first light transmission property G in all sections of the first class section group (only light transmission portions 102, 103, and 105 are illustrated) (corresponds to sections 2, 3, 4 and 5 in FIG. 5B). This first order process correlates to the first class process.

The second order process: After the first order process, the film forming stage is performed to form the light transmission film 200, which has the second light transmission property B, on the surface of the intermediate film 700 (FIG. 6D). Next, the light transmission film 200 is left on the fifth section 5, the sixth section 6, the seventh section 7, the eighth section 8, and the ninth section 9 of the second class section group, and then the patterning stage is performed to remove the light transmission film 200 from the top of all sections of the first class section group, all sections of the third class section group, and the first section 1 (FIG. 6E). Furthermore, as the light transmission portions that have the first light transmission property G already exist in the first class section group, removing from the top of the first class section group means the portion of the light transmission film 200 that is positioned on top of the light transmission portions that have the first light transmission property G. This second order process results in the formation of the light transmission portions that have the second light transmission property B in all sections of the second class section group (only light transmission portions 206 and 207 are illustrated) (corresponds to sections 6, 7, 8 and 9 in FIG. 5C). This second order process correlates to the second class process.

The third order process: After the second order process, the film forming stage is performed to form the light transmission film 300, which has the third light transmission property R, on the surface of the intermediate film 700 (FIG. 6F). Next, the light transmission film 300 is left on the tenth section 10, the eleventh section 11, the twelfth section 12, and the thirteenth section 13 of the third class section group, and then the patterning stage is performed to remove the light transmission film 300 from the top of all sections of the first class section group, the top of all sections of the second class section group, and the first section 1 (FIG. 6G). This third order process results in the formation of the light transmission portions that have the third light transmission property R in all sections of the third class section group (only light transmission portions 310 and 313 are illustrated) (these correspond to sections 10-13 in FIG. 5D). This third order process correlates to the third class process.

The fourth order process: After the third order process, the film forming stage is performed to form the light transmission film 400, which has the fourth light transmission property W, on the surface of the intermediate film 700 (FIG. 6H). After this, the patterning stage is not performed for the image pickup region 1100. Therefore, the light transmission film 400 is left on top of the first class section group, on top of the second class section group, and on top of the third class section group. This fourth order process results in the formation of the light transmission portions 401 that have the fourth light transmission property W in the first section 1. This fourth order process correlates to the fourth class process (corresponds to shaded section 1 in FIG. 5E).

The post-process: After the fourth order process, the multiple focus portions are formed on the surface of the light transmission film 400. Within the multiple focus portions, the light transmission film 400 lies between the focus portion positioned on the top of all sections of the first section group and the light transmission portions configured in the first class section group. Thus, the light transmission member 800 is formed as described above.

REFERENCE EMBODIMENTS

FIGS. 7A through 8I illustrate reference embodiments of when method (j) is employed. FIGS. 7A through 7F and FIG. 8A through 8I are described using the same expressions as FIGS. 5A through 5F and FIGS. 6A through 6I, and so their descriptions are omitted.

Pre-process: FIG. 7A illustrates the predetermined plane PP of each section before the forming of the light transmission member 800 on the surface of the intermediate film 700, as described in FIG. 4, and the cross-sectional diagrams in FIG. 7A are the same as those in FIG. 6A, and so their descriptions are omitted.

Figure 8A:
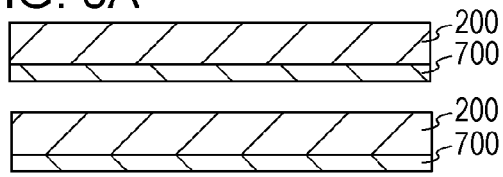
FIGS. 8A through 8I are explanatory diagrams illustrating a reference embodiment.
Figure 8B:

The first order process: First, the film forming stage is performed to form the light transmission film 200, which has the second light transmission property B, on the surface of the intermediate film 700 (FIG. 8A). Next, the light transmission film 200 is left on the sixth section 6, the seventh section 7, the eighth section 8, and the ninth section 9 of the second class section group, and then the patterning stage is performed to remove the light transmission film 200 from all sections of the first class section group, all sections of the third class section group, and the first section 1 (FIG. 8B). This first order process results in the formation of the light transmission portions that have the second light transmission property B in all sections of the second class section group (only light transmission portions 306 and 307 are illustrated) (FIG. 7B). This first order process correlates to the second class process.

Figure 8C:
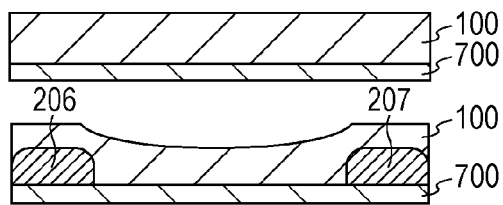
Figure 8D:
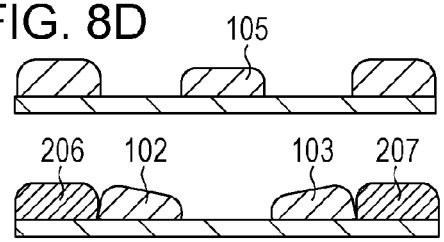

The second order process: After the first order process, the film forming stage is performed to form the light transmission film 100, which has the first light transmission property G, on the surface of the intermediate film 700 (FIG. 8C). Next, the light transmission film 100 is left on the second section 2, the third section 3, the fourth section 4, and the fifth section 5 of the first class section group, and then the patterning stage is performed to remove the light transmission film 100 from the top of all sections of the second class section group, all sections of the third class section group, and the first section 1 (FIG. 8D). Furthermore, as the light transmission portions that have the second light transmission property B already exist in the second class section group, removing from the top of the second section group means the portion of the light transmission film 100 that is positioned on top of the light transmission portions that have the second light transmission property B. This second order process results in the formation of the light transmission portions that have the first light transmission property G in all sections of the first class section group (only light transmission portions 102, 103, and 105 are illustrated) (FIG. 7C). This second order process correlates to the first class process.

Figure 8E:
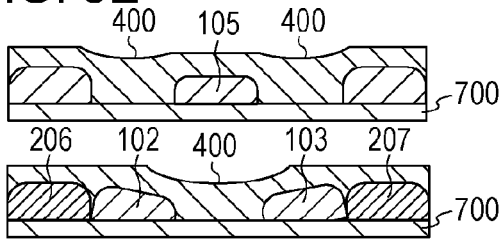
Figure 8F:
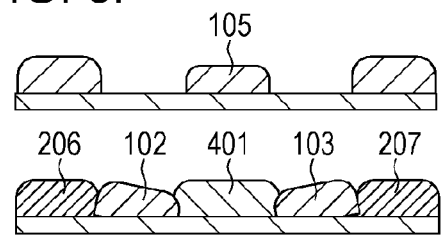

The third order process: After the second order process, the film forming stage is performed to form the light transmission film 400, which has the fourth light transmission property W, on the surface of the intermediate film 700 (FIG. 8E). Next, the light transmission film 400 is left on the first section 1, and then the patterning stage is performed to remove the light transmission film 400 from the top of all sections of the first class section group, from the top of all sections of the second class section group, and all sections of the third class section group (FIG. 8F). This third order process results in the formation of the light transmission portions (light transmission portions 401) that have the fourth light transmission property W in the first section 1. This third order process correlates to the fourth class process (FIG. 7D).

Figure 8G:
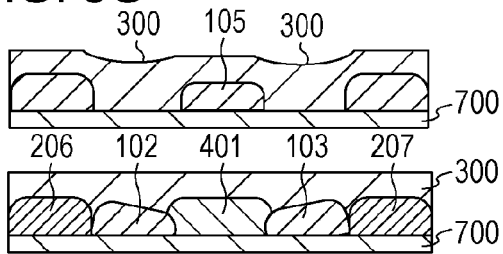
Figure 8H:
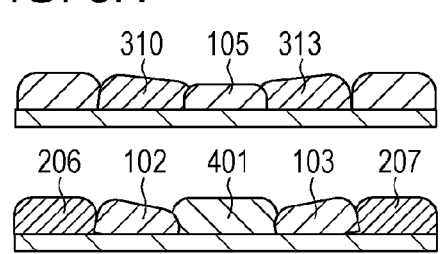
Figure 8I:
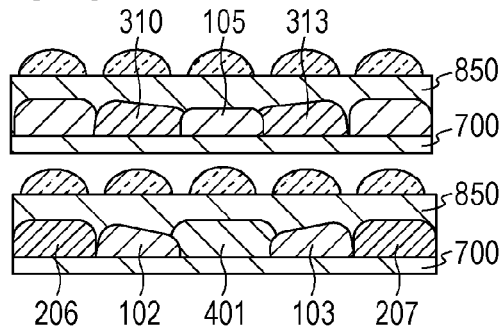

The fourth order process: After the third order process, the film forming stage is performed to form the light transmission film 300, which has the third light transmission property R, on the surface of the intermediate film 700 (FIG. 8G). Next, the light transmission film 300 is left on the tenth section 10, the eleventh section 11, the twelfth section 12, and the thirteenth section 13 of the third class section group, and then the patterning stage is performed to remove the light transmission film 300 from above all sections of the first class section group, above all sections of the second class section group, and above the first section 1 (FIG. 8H). This fourth order process results in the formation of the light transmission portions that have the third light transmission property R in all sections of the first class section 1 (only light transmission portions 310 and 313 are illustrated) (FIG. 7D). This fourth order process correlates to the third class process.

The post-process: After the fourth order process, a planarized film 850 is formed on the surface of the intermediate film 700. Multiple focus portions are formed on the surface of the planarized film 850. Within the multiple focus portions, the planarized film 850 lies between the focus portion positioned on the top of the first section 1 and the light transmission portions configured in the first class section group. Thus, the light transmission member 800 is formed as described above using a reference embodiment.

However, there are some disadvantages with the reference embodiment in comparison with the other embodiments. One disadvantage is the shape of the light transmission portion in each section of the first class section group. When comparing the first class section group and the second class section group, the light transmission portions configured in each section of the first class section group have wide-band light transmission properties, and the effect of the light transmission portions configured in the first section 1 is more readily received than with the light transmission portions configured in each section of the second class section group.

The reason for this is that either Condition (i) or Condition (ii) is not satisfied. Condition (i) is not satisfied in the reference embodiment described above. At the time of the first class process, which is the second order process in the reference embodiment, the light transmission portions are not formed in the first section 1, even though the light transmission portions are already formed in all sections of the second class section group, which is positioned on the opposite side of the first section 1 in the first class section group. For this reason, as illustrated in FIG. 8C, regarding each and every section in the second class section group at the film forming stage of the first class process, the light transmission film 100 in the second class section group side is thickly formed, and is thinly formed on the first section 1 side. Also, the light transmission film 100 is more thinly formed in the first section 1. Also, when patterning is performed during the patterning stage, the light transmission portions 102 and 103 are thickly formed on the second class section group side, and thinly formed on the first section 1 side as illustrated in FIG. 8D. It is difficult to obtain adequate spectral properties if the light transmission portion is too thin, which will result in degradation in image quality and focus detection accuracy.

Conversely, according to the first embodiment which employs method (b), at the time of the first class process, which is the first order process, the light transmission portions are not formed in both the first section 1 and all sections of the second class section group positioned on the opposite side of the first section 1 in the first class section group. For this reason, the light transmission portions in all sections of the first class section group may be formed symmetrically along both the X axis and the Y axis. Thus, variance in the transmittance of each light transmission portion formed in all sections of the first class section group may be reduced.

The second disadvantage is the complexity of the fourth class process. The reason for this is that Condition (v) is not satisfied. When Condition (v) is satisfied, the process may be simplified by removing the patterning stage for the light transmission film 400 that has the fourth light transmission property W. Conversely, if Condition (v) is not satisfied, the patterning stage has to be performed at the fourth class process in order to arrange the light transmission films formed after the fourth class process in the desired sections.

Second Embodiment

FIGS. 9A through 9F illustrate a second embodiment as an example involving methods (a) and (b). FIGS. 9A through 9F use the same expressions as FIGS. 5A through 5F, and so their descriptions are omitted.

Pre-process: The pre-process may be performed in the same way as in the first embodiment, and so its description is omitted.

The first order process: First, the film forming stage is performed to form the light transmission film 200, which has the second light transmission property B, on the surface of the intermediate film 700. Next, the light transmission film 200 is left on the second section 2 and the third section 3 of the first class section group, and then the patterning stage is performed to remove the light transmission film 200 from the fourth section 4 and the fifth section 5 of the first class section group, all sections of the second class section group, all sections of the third class section group, and the first section 1. This first order process results in the formation of the light transmission portions that have the second light transmission property B in a part of the sections of the first class section group (FIG. 9B). This first order process correlates to the first class process.

The second order process: After the first order process, the film forming stage is performed to form the light transmission film 300, which has the third light transmission property R, on the surface of the intermediate film 700. Next, the light transmission film 300 is left on the fourth section 4 and the fifth section 5 of the first class section group, and then the patterning stage is performed to remove the light transmission film 300 from the top of the second section 2 and the third section 3 of the first class section group, all sections of the second class section group and the first section 1. This second order process results in the formation of the light transmission portions that have the third light transmission property R in the remaining sections of the first class section group (FIG. 9C). This second order process also correlates to the first class process.

The third order process: After the second order process, the film forming stage is performed to form the light transmission film 100, which has the first light transmission property G, on the surface of the intermediate film 700. Next, the light transmission film 100 is left on the sixth section 6, the seventh section 7, the eighth section 8, and the ninth section 9 of the second class section group, and on the tenth section 10, the eleventh section 11, the twelfth section 12, and the thirteenth section 13 of the third class section group. The patterning stage is performed to remove from the top of all sections of the first class section group, and the first section 1. This third order process results in the formation of the light transmission portions that have the first light transmission property G in all sections of the second class section group and all sections of the third class section group (FIG. 9D). This third order process correlates to the second class process and the third class process.

The fourth order process: After the third order process, the film forming stage is performed to form the light transmission film 400, which has the fourth light transmission property W, on the surface of the intermediate film 700 (FIG. 6H). After this, the patterning stage is not performed in the image pickup region 1100. Therefore, the light transmission film 400 is left on top of the first class section group, on top of the second class section group, and on top of the third class section group. This fourth order process results in the formation of the light transmission portions that have the fourth light transmission property W in the first section 1. This fourth order process correlates to the fourth class process (FIG. 5E).

Post-process: The post-process is performed in the same way as in the first embodiment, and so its description is omitted. Thus, the light transmission member 800 may be formed according to the description above.

Third Embodiment

FIGS. 10A through 10F illustrate a third embodiment as an example involving methods (h) and (j). FIGS. 10A through 10F use the same expressions as FIGS. 5A through 5F, and so their descriptions are omitted.

Pre-process: The pre-process may be performed in the same way as in the first embodiment, and so its description is omitted.

The first order process: First, the film forming stage is performed to form the light transmission film 100, which has the first light transmission property G, on the surface of the intermediate film 700. Next, the light transmission film 100 is left on the tenth section 10, the eleventh section 11, the twelfth section 12, and the thirteenth section 13 of the third class section group, and then the patterning stage is performed to remove the light transmission film 100 from all sections of the first class section group, all sections of the second class section group, the remaining sections of the third class section group, and the first section 1. This first order process results in the formation of the light transmission portions that have the first light transmission property G in all sections of the third class section group (FIG. 10B). This first order process correlates to the third class process.

The second order process: After the first order process, the film forming stage is performed to form the light transmission film 200, which has the second light transmission property B, on the surface of the intermediate film 700. Next, the light transmission film 200 is left on the second section 2 and the fifth section 5 of the first class section group, and then the patterning stage is performed to remove the light transmission film 200 from the top of all sections of the third class section group, the fourth section 4 and the fifth section 5 of the first class section group, all sections of the third class section group, and the first section 1. This second order process results in the formation of the light transmission portions that have the second light transmission property B in some sections of the first class section group (FIG. 10C). This second order process correlates to the first class process.

The third order process: After the second order process, the film forming stage is performed to form the light transmission film 300, which has the third light transmission property R, on the surface of the intermediate film 700. Next, the light transmission film 300 is left on the fourth section 4 and the fifth section 5 of the first class section group, and then the patterning stage is performed to remove the light transmission film 300 from the top of the second section 2 and the third section 3 of the first class section group, from the top of all sections of the third class section group, all sections of the second class section group, and the first section 1. This third order process results in the formation of the light transmission portions that have the third light transmission property R in the remaining sections of the second class section group (FIG. 10D). This third order process also correlates to the first class process.

The fourth order process: After the third order process, the film forming stage is performed to form the light transmission film 400, which has the fourth light transmission property W, on the surface of the intermediate film 700 (FIG. 6E). After this, the patterning stage is not performed in the image pickup region 1100. Therefore, the light transmission film 400 is left on top of the first class section group, on top of the third class section group, on all sections of the second class group, and the first section 1. This fourth order process results in the formation of the light transmission portions 401 that have the fourth light transmission property W in the first section 1. This fourth order process correlates to the fourth class process (FIG. 10E).

Post-process: The post-process may be performed in the same as that in the first embodiment, and so its description is omitted. Thus, the light transmission member 800 may be formed as described above.

Fourth Embodiment

FIGS. 11A through 11F illustrate a fourth embodiment as an example involving methods (a), (b), (c), (d), (e), and (f). FIGS. 11A through 11F use the same expressions as FIGS. 5A through 5F, and so their descriptions are omitted.

Pre-process: The pre-process may be performed in the same way as in the first embodiment, and so its description is omitted.

The first order process: First, the film forming stage is performed to form the light transmission film 100, which has the first light transmission property G, on the surface of the intermediate film 700. Next, the light transmission film 100 is left on the second section 2 and the third section 3 of the first class section group, and then the patterning stage is performed to remove the light transmission film 100 from the fourth section 4 and the fifth section 5 of the first class section group, all sections of the second class section group, all sections of the third class section group, and the first section 1. This first order process results in the formation of the light transmission portions that have the first light transmission property G in some sections of the first class section group (FIG. 11B). This first order process correlates to the first class process.

The second order process: After the first order process, the film forming stage is performed to form the light transmission film 200, which has the second light transmission property B, on the surface of the intermediate film 700. Next, the light transmission film 200 is left on the fourth section 4 of the first class section group, and then the patterning stage is performed to remove the light transmission film 200 from the top of second section 2 and the third section 3 of the first class section group, the fifth section 5 of the first class section group, all sections of the third class section group, and the first section 1. This second order process results in the formation of the light transmission portions that have the second light transmission property B in some sections of the first class section group (FIG. 11C). This second order process also correlates to the first class process.

The third order process: After the second order process, the film forming stage is performed to form the light transmission film 300, which has the third light transmission property R, on the surface of the intermediate film 700. Next, the light transmission film 300 is left on the fifth section 5 of the first class section group, and then the patterning stage is performed to remove the light transmission film 300 from the top of the second section 2, the third section 3, and the fourth section 4 of the first class section group, all sections of the second class section group, all sections of the third class section group, and the first section 1. This third order process results in the formation of the light transmission portions that have the third light transmission property R in the fifth section 5 of the first class section group (FIG. 11D). This third order process correlates to the first class process.

The fourth order process: After the third order process, the film forming stage is performed to form the light transmission film 400, which has the fourth light transmission property W, on the surface of the intermediate film 700 (FIG. 11E). After this, the patterning stage is not performed in the image pickup region 1100. Therefore, the light transmission film 400 is left on top of all sections of the first class section group. This fourth order process results in the formation of the light transmission portions 401 that have the fourth light transmission property W in the first section 1, all sections of the second class group, and all sections of the third class group. This fourth order process correlates to the second class process, the third class process, and the fourth class process (FIG. 11E).

Post-process: The post-process may be performed in the same as that in the first embodiment, and so its description is omitted. Thus, the light transmission member 800 may be formed as described above.

The light transmission member 800 is not only applicable to the image pickup device, but also may be applicable in color display devices that use color filter arrays, such as transmission-type liquid crystal displays, reflective-type liquid crystal displays, organic electroluminescence (hereinafter, EL) display devices, inorganic EL display devices, and field emission-type electron beam display devices.

Figure 12A:
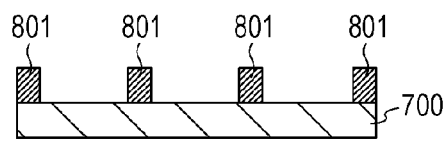
FIGS. 12A through 12J are explanatory diagrams illustrating an example of modifications of a pre-process state and a post-process.
Figure 12B:
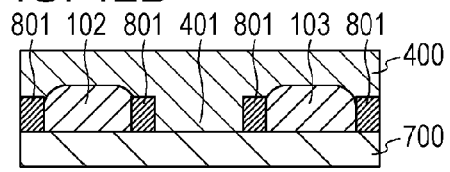

An example of a first modification of the pre-process will be described with reference to FIG. 12A and FIG. 12B. As illustrated in FIG. 12A, a partition 801 is formed at the boundary of each section on the surface the intermediate film 700 before the forming of the light transmission portions. As described above with regard to the first embodiment through the fourth embodiment, when the partition 801 is not formed, the light transmission film formed at each forming process is in contact with the side surface of the light transmission portion formed at the previous forming process, and so this causes the light transmission portion to be easily affected by the shape of the side surface of the light transmission portion formed at the previous forming process. By configuring the partition 801 as in the present modification, the effect of the shape of the side surface of the light transmission portion formed at the previous forming process may be reduced.

Figure 12C:
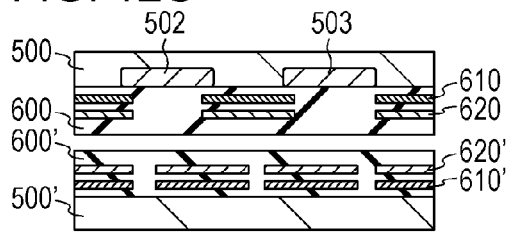
Figure 12D:
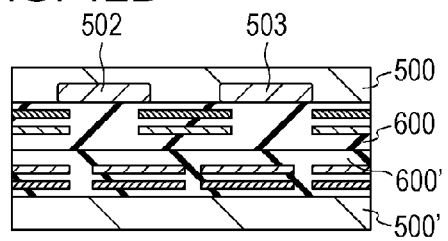
Figure 12E:
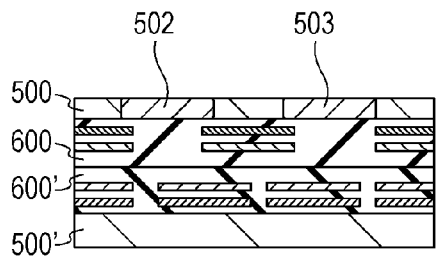
Figure 12F:
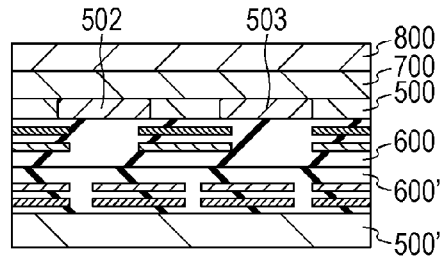

A second modification of the pre-process will be described with reference to FIGS. 12C through 12F. The second modification is an example applicable to filmed backside illumination image pickup devices that include multiple semiconductor substrates. The semiconductor substrate 500 that includes multiple photoelectric conversion portions is created, and then the insulating film 600 and multiple metal films 610 and 620 are formed on the surface of the semiconductor substrate 500. Also, the semiconductor substrate 500' that includes signal processing circuits is created, and the insulating film 600' and multiple metal films 610' and 620' are formed on the surface of the semiconductor substrate 500' (FIG. 12C). The semiconductor substrate 500 and the semiconductor substrate 500' are filmed together so as to sandwich the insulating film 600 and the multiple metal films 610 and 620 with the insulating film 600' and the multiple metal films 610' and 620'. Next, the semiconductor substrate 500 and the semiconductor substrate 500' are fixed together using an adhesive, or by the joining of the metal films, or the insulating films (FIG. 12D). After this, from the back side of the side where the insulating film 600 has been formed on the semiconductor substrate 500, the semiconductor substrate 500 is thinned by 1 to 10 μm, using mechanical polishing, chemical polishing, chemical-mechanical polishing (CMP), or similar (FIG. 12E). Next, the intermediate film 700 is formed on this back surface. Next, the light transmission member 800 is formed on the surface of the intermediate film 700, which acts as a substrate (FIG. 12F). Of course, the semiconductor 500' may be used as a simple supporting substrate, and in this case, the insulating film 600' and multiple metal films 610' and 620' may be omitted.

Figure 12G:
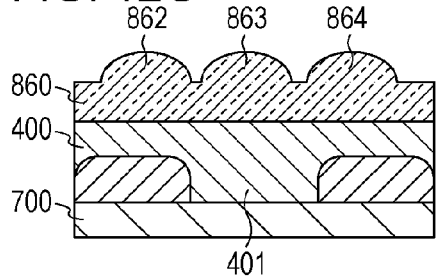
Figure 12H:
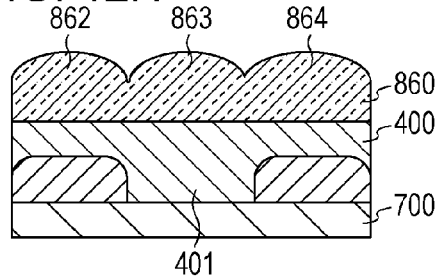
Figure 12I:
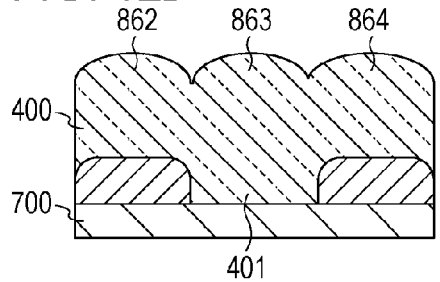

A first modification of the post-process will be described with reference to FIG. 12G. In FIG. 2, the multiple focus portions 862, 863, and 864 were described as individual portions, but as illustrated in FIG. 12G, the same material for the multiple focus portions 862, 863, and 864 may be connected to form a base 860. The multiple focus portions 862, 863, and 864 connected in this way may be formed using etchback or gradation exposure. Also, as illustrated in FIG. 12H, a so-called gapless microlens may be formed where boundaries are formed among the multiple focus portions 862, 863, and 864. Also, though the focus portions are formed on the surface of the light transmission film 400 as illustrated in FIG. 2, the light transmission film 400 itself may be formed from the focus portions 862, 863, and 864, as illustrated in FIG. 7E. When the focus portions 862, 863, and 864 are formed in the light transmission film 400 itself, the light transmission film 400 that has the fourth light transmission property W formed at the fourth class process is preferably thicker than the other light transmission films 100, 200, and 300.

Figure 12J:
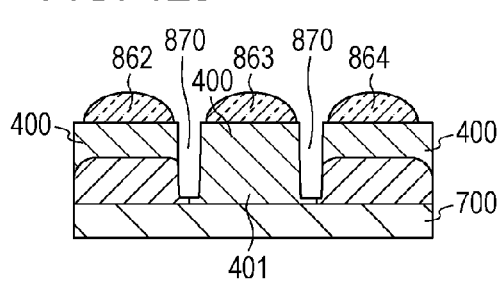

Also, the light transmission member may have a dividing portion that optically divides the multiple light transmission portions. The dividing portion preferably has a refractive index lower than the refractive index of the light transmission portion. After forming the light transmission portion, a channel 870 positioned at the boundary of each section is formed between the light transmission portions. A so-called air gap construction including air or some other gas may be used for the channel 870. Also, a solid may be embedded into the channel 870. The solid embedded into the channel 870 may include a light-shielding material such as metal or black color material, or may include a low refractive index material with a refractive index lower than that of the light transmission portion. After the multiple focus portions 862, 863, and 864 are formed, the channel 870 is formed as in the example in FIG. 12J, but the multiple focus portions 862, 863, and 864 may be formed after the channel 870 is formed.

EXAMPLES

An example of the forming method for the light transmission member 800 according to the pattern illustrated in FIG. 1B will be described with reference to FIGS. 13A through 13D. The forming method of the present example employs the method of the first embodiment.

Figures 13A, 13B:
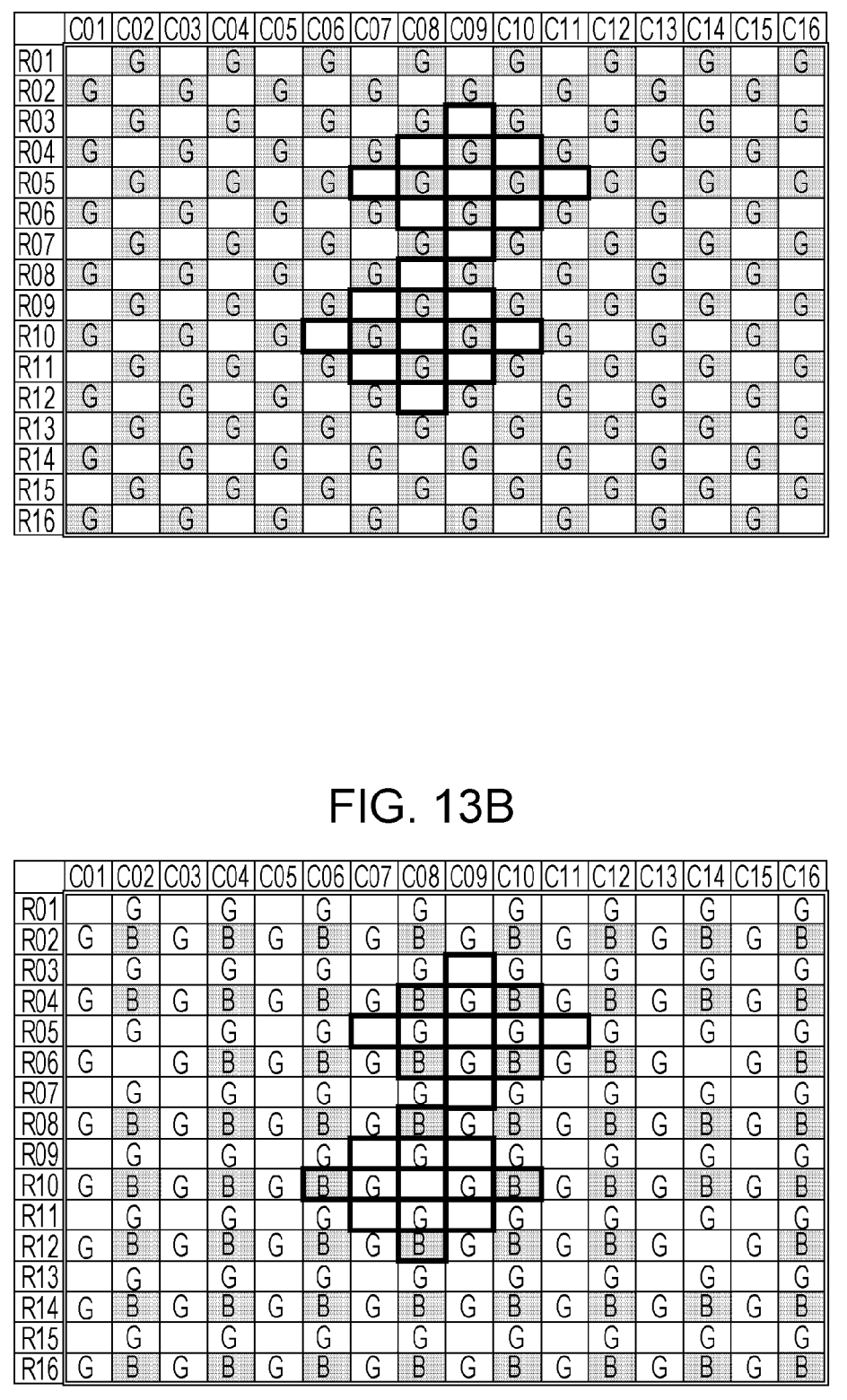
Figures 13E, 13F:
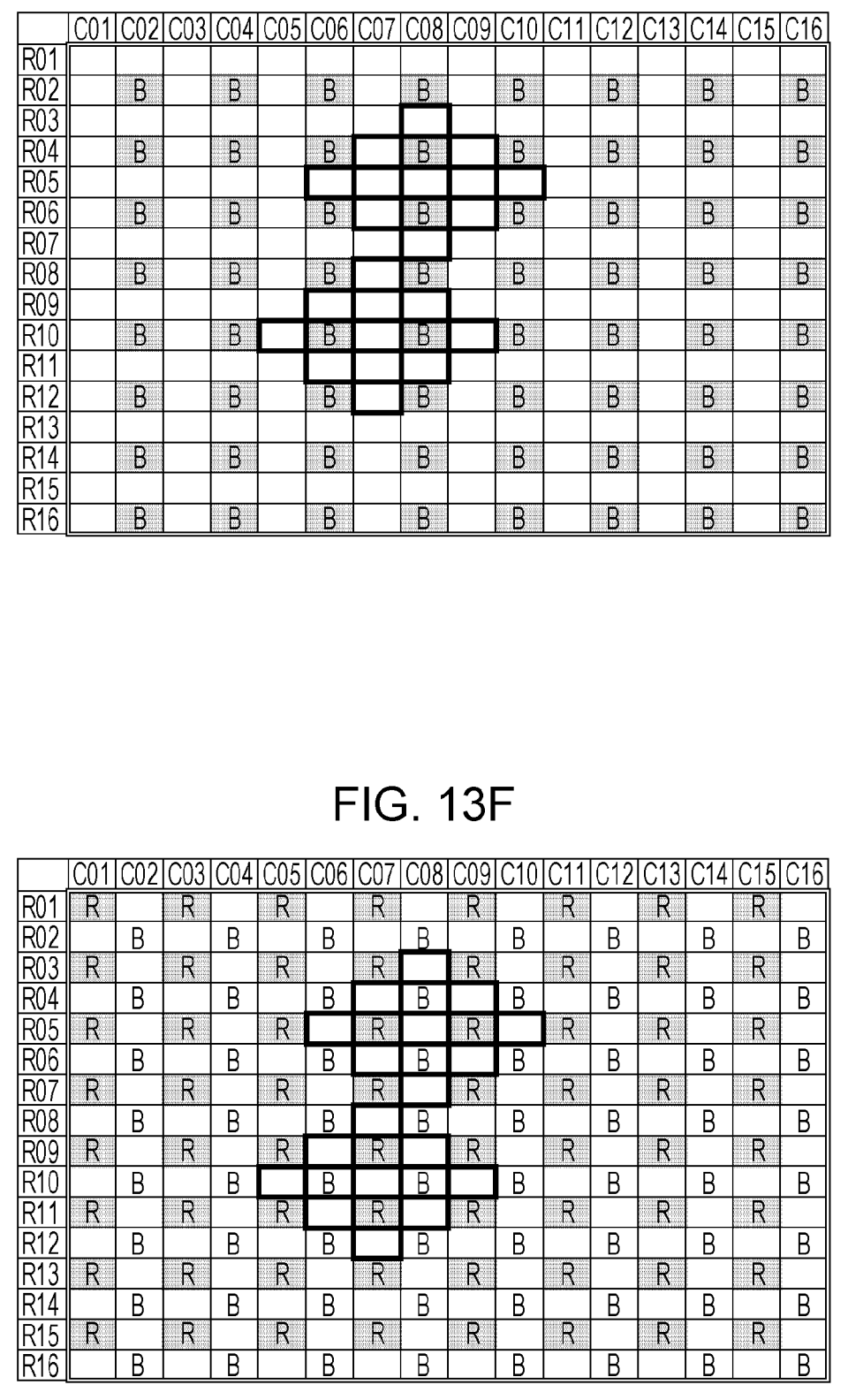

As the first order process, the light transmission portion that has the first light transmission property G is formed (FIG. 13A). As the second order process, the light transmission portion that has the second light transmission property B is formed (FIG. 13B). As the third order process, the light transmission portion that has the third light transmission property R is formed (FIG. 13D). As the fourth order process, the light transmission portion that has the fourth light transmission property W is formed (FIG. 13E). Thus, the light transmission member 800 is formed as described above. The first order process correlates to the first class process, and the fourth order process correlates to the fourth class process. If we take the pixels at R06/C02, R10/C08, R12/C14, R06/C14 as belonging to the first section 1, the second order process correlates to the second class process, and the third order process correlates to the third class process. Conversely, if we take the pixels at R03/C03, R05/C09, R03/C15, and R15/C03 as belonging to the first section 1, the second order process correlates to the third class process, and the third order process correlates to the second class process.

An example of the forming method for the light transmission member 800 according to a modification of the pattern illustrated in FIG. 1B will be described with reference to FIGS. 13E through 13H. The forming method of the present example employs the method of the second embodiment.

As the first order process, the light transmission portion that has the second light transmission property B is formed (FIG. 13E). As the second order process, the light transmission portion that has the third light transmission property R is formed (FIG. 13F). As the third order process, the light transmission portion that has the first light transmission property G is formed (FIG. 13G). As the fourth order process, the light transmission portion that has the fourth light transmission property W is formed (FIG. 13H). Thus, the light transmission member 800 is formed as described above. The first order process correlates to the second class process, and the fourth order process correlates to the fourth class process. The second class process and the third class process are performed simultaneously as the third order process. In other words, the third order process combines the second class process and the third class process.

Examples of several other light transmission portion arrangement patterns are given in FIG. 14, and one of these forming examples will be described. The arrangements illustrated in FIG. 14A through FIG. 14F may be ubiquitous on the entire surface of the imagine region 1100, or may be unevenly distributed on a portion of the image pickup region 1100. FIG. 14A through FIG. 14F illustrate these arrangements as matrices of sections sized 12 rows by 12 columns. The light transmission properties of the light transmission portions, which have narrow-band light transmission properties formed in each section, illustrated are the first light transmission property G, the second light transmission property B, and the third light transmission property R. The fourth light transmission property W is illustrated as the wide-band light transmission property. For example, the first light transmission property G has the green color transmission band, the second light transmission property B has the blue color transmission band, the third light transmission property R has the red color transmission band, and the fourth light transmission property W has the white color transmission band, but these are not necessarily restricted. The light transmission portion that has the fourth light transmission property W is formed in the first section, but the absolute transmission wavelength band and/or the relative transmission wavelength band of the fourth light transmission property W may be wider than the absolute transmission wavelength band and/or the relative transmission wavelength band of the light transmission portions formed in each section of the first class section group. The light transmission portions formed in each section are formed so that Condition (i) and Condition (ii) are satisfied. That is to say, they are formed using any of the methods (a), (b), (c), (d), (e), (f), (g), and (h) illustrated in Table 1. It is particularly preferable to perform the forming using either method (a) or (b).

As the first class process for the example in FIG. 14A, the second type process is performed to form the light transmission portion that has the second light transmission property B. Also as the first class process, the third type process is performed to form the light transmission portion that has the third light transmission property R. The sequence of the second type process and the third type process is optional. After this, as a combination of the second class process and the third class process, the first type process is performed to form the light transmission portion that has the first light transmission property G. Also as a combination of the second class process, the third class process, and the fourth class process, the fourth type process is performed to form the light transmission portion that has the fourth light transmission property W. The sequence of the first type process and the fourth type process is optional, but it is preferable for the fourth type process to be performed after the first type process.

As the first class process for the example in FIG. 14B, the second type process is performed to form the light transmission portion that has the second light transmission property B. Also as the first class process, the third type process is performed to form light transmission portion that has the third light transmission property R. The sequence of the second type process and the third type process is optional. After this, as a combination of the second class process and the third class process, the first type process is performed to form the light transmission portion that has the first light transmission property G. Also as a combination of the third class process and the fourth class process, the fourth type process is performed to form the light transmission portion that has the fourth light transmission property W. The sequence of the first type process and the fourth type process is optional, but it is preferable for the fourth type process to be performed after the first type process.

As the first class process for the example in FIG. 14C, the second type process is performed to form the light transmission portion that has the second light transmission property B. Also as the first class process, the third type process is performed to form light transmission portion that has the third light transmission property R. After this, as a combination of the second class process and the fourth class process, the fourth type process is performed to form the light transmission portion that has the fourth light transmission property W. Also as the third class process, the first type process is performed to form the light transmission portion that has the first light transmission property G. The timing of the first type process is optional, but it is preferable to be performed after the second type process and the third type process. Also, it is preferable to perform the first type process before the fourth type process. Also, it is preferable for the fourth type process to be performed last.

As the first class process for the example in FIGS. 14D and 14E, the first type process is performed to form the light transmission portion that has the first light transmission property G. Also as the first class process, the second type process is performed to form light transmission portion that has the second light transmission property B. Also as the first class process, the third type process is performed to form the light transmission portion that has the third light transmission property R. The order the first type process, the second type process, and the third type process, is optional. After this, as a combination of the second class process, the third class process, and the fourth class process, the fourth type process is performed to form the light transmission portion that has the fourth light transmission property W.

As a combination of the first class process and the third class process for the example in FIG. 14F, the first type process is performed to form the light transmission portion that has the first light transmission property G. Also as the first class process, the second type process is performed to form light transmission portion that has the second light transmission property B. Also as the first class process, the third type process is performed to form the light transmission portion that has the third light transmission property R. The sequence of the first type process, the second type process, and the third type process is optional, but it is preferable for the second type process and the third type process to be performed before the first type process. After this, as a combination of the second class process and the fourth class process, the fourth type process is performed to form the light transmission portion that has the fourth light transmission property W.

As a combination of the first class process and the third class process for the example in FIG. 14G, the first type process is performed to form the light transmission portion that has the first light transmission property G. After this, as the second class process, the second type process is performed to form light transmission portion that has the second light transmission property B. Also the third type process is performed to form the light transmission portion that has the third light transmission property R. Note that, this second type process is performed as the second class process, regarding the section R09/C03 as another first section, and each section R09/C01, R09/C05, R07/C03, and R11/C03 make up another second class section group. Also, as the fourth class process, the fourth type process is performed to form the light transmission portion that has the fourth light transmission property W. The sequence of the second type process, the third type process, and the fourth type process is optional, but it is preferable for the fourth type process to be performed last.

As the first class process for the example in FIG. 14H, the first type process is performed to form the light transmission portion that has the first light transmission property G. After this, as a combination of the second class process and the fourth class process, the fourth type process is performed to form light transmission portion that has the fourth light transmission property W. As the third class process, the second type process is performed to form the light transmission portion that has the second light transmission property B, at any desired timing. Also as the third class process, the third type process is performed to form the light transmission portion that has the third light transmission property R. The timing of the second type process and the third type process is optional, but it is preferable for the second type process and the third type process to be performed after the first type process. Also, it is preferable for the fourth type process to be performed last.

As a combination of the first class process and the third class process for the example in FIG. 14I, the first type process is performed to form the light transmission portion that has the first light transmission property G. After this, as the second class process, the second type process is performed to form light transmission portion that has the second light transmission property B. Also as the second class process for another first section, the third type process is performed to form the light transmission portion that has the third light transmission property R. Also as a process serving as both the second class process and the fourth class process, the fourth type process is performed to form light transmission portion that has the fourth light transmission property W. The order of the second type process, the third type process, and the fourth type process is optional, but it is preferable for the second type process and the third type process to be performed after performing the first type process. Also, it is preferable for the fourth type process to be performed last.

Thus, a light transmission member with superior optical properties may be obtained by forming the light transmission portion with multiple forming processes in sequences that satisfy Condition (i) and Condition (ii) as described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-038881, filed Feb. 24, 2012, which is hereby incorporated by reference herein in its entirety.

What is claimed is:

1. A method to form a light transmission member comprising:
 a series of processes to form light transmission portions, each of the processes including forming a light transmission film and leaving the light transmission film in any of a plurality of sections of a predetermined plane, and each of the processes being performed for each formation of each light transmission film having different light transmission properties,
  the plurality of sections of the predetermined plane including a first section, a second section, a third section, a fourth section, a fifth section, a sixth section, a seventh section, an eighth section, and a ninth section,
  regarding a first direction of the predetermined plane, the first section is between the second section and the third section, the second section and the third section are between the sixth and the seventh section, the second section is adjacent to the first section and sixth section, and the third section is adjacent to the first section and the seventh section,
  regarding a second direction that intersects the first direction of the predetermined plane, the first section is between the fourth section and the fifth section, the fourth section and the fifth section are between the eighth section and the ninth section, the fourth section is adjacent to the first section and the eighth section, and the fifth section is adjacent to the first section and the ninth section,
 wherein the light transmission portion disposed in the first section exhibits a green color, red color and blue color light transmittance at or above a predetermined value, the light transmission portions disposed in each of the second section, the third section, the fourth section, and the fifth section exhibit at least one of a green color, red color and blue color light transmittance at or above a predetermined value, and the light transmission portions disposed in each of the second section, the third section, the fourth section, and the fifth section exhibit at least one of a green color, red color and blue color light transmittance below the predetermined value,
 and wherein, in the series of processes, after the light transmission portions are formed for the second section, the third section, the fourth section, and the fifth section, the light transmission portions are formed for the first section, the sixth section, the seventh section, the eighth section, and the ninth section.

2. The method to form a light transmission member according to claim 1, wherein, in the series of processes, the process to form the light transmission member in the first section is performed last.

3. The method to form a light transmission member according to claim 1;
 wherein the plurality of section includes a tenth section, an eleventh section, a twelfth section, and a thirteenth section;
 and wherein the first section is between the tenth section and the eleventh section, the second section and the fourth section are adjacent to the tenth section, the third section and the fifth section are adjacent to the eleventh section, the first section is between the twelfth section and the thirteenth section, the third section and the fourth section are adjacent to the twelfth section, and second section and the fifth section are adjacent to the thirteenth section;

and wherein, in the series of processes, after the forming of the light transmission portions in the second section, the third section, the fourth section, and the fifth section, the light transmission portions are formed in the tenth section, the eleventh section, the twelfth section, and the thirteenth section.

4. The method to form a light transmission member according to claim 1;

wherein the plurality of sections includes a tenth section, an eleventh section, a twelfth section, and a thirteenth section;

and wherein the first section is between the tenth section and the eleventh section, the second section and the fourth section are adjacent to the tenth section, the third section and the fifth section are adjacent to the eleventh section, the first section is between the twelfth section and the thirteenth section, the third section and the fourth section are adjacent to the twelfth section, and the second section and the fifth section are adjacent to the thirteenth section;

and wherein, after the forming of the light transmission portions in the tenth section, the eleventh section, the twelfth section, and the thirteenth section, the light transmission portion is formed in the first section.

5. The method to form a light transmission member according to claim 1;

wherein the plurality of sections includes a tenth section, an eleventh section, a twelfth section, and a thirteenth section;

and wherein the first section is between the tenth section and the eleventh section, the second section and the fourth section are adjacent to the tenth section, the third section and the fifth section are adjacent to the eleventh section, the first section is between the twelfth section and the thirteenth section, the third section and the fourth section are adjacent to the twelfth section, and the second section and the fifth section are adjacent to the thirteenth section;

and wherein, while simultaneously forming the light transmission portion in the first section, the light transmission portions are also formed in at least one of the sixth section, the seventh section, the eighth section, the ninth section, the tenth section, the eleventh section, the twelfth section, and the thirteenth section.

6. The method to form a light transmission member according to claim 1;

wherein the light transmission portions disposed in each of the sixth section, the seventh section, the eighth section, and the ninth section exhibit at least one of a green color, red color and blue color light transmittance at or above the predetermined value, and the light transmission portions disposed in each of the sixth section, the seventh section, the eighth section, and the ninth section exhibit at least one of a green color, red color and blue color lights transmittance below the predetermined value.

7. The method to form a light transmission member according to claim 1, wherein the predetermined value is 50%.

8. The method to form a light transmission member according to claim 1, wherein the light transmission member formed in the first section exhibits a transmittance higher than the maximum value of a green color, red color and blue color light transmittance of the light transmission portions disposed in each of the second section, the third section, the fourth section, and the fifth section.

9. The method to form a light transmission member according to claim 1, wherein the series of processes includes:

a first process including
 a stage of using a spin coating method to form a first light transmission film in which the green color light transmittance is at or above 50%, and the red color and blue color light transmittance is below 50%, and
 a patterning stage of removing a portion of the first light transmission film from at least the first section, a second process including
 a stage of using a spin coating method to form a second light transmission film in which the red color light transmittance is at or above 50%, and the green color and blue color light transmittance is below 50%, and
 a patterning stage of removing a portion of the second light transmission film from at least the first section, a third process including
 a stage of using a spin coating method to form a third light transmission film in which the blue color light transmittance is at or above 50%, and the green color and red color light transmittance is below 50%, and
 a patterning stage of removing a portion of the third light transmission film from at least the first section; and a fourth process including
 a stage of using a spin coating method to form a fourth light transmission film in which the green color, red color, and blue color light transmittance is at or above 50%, and leaving the fourth light transmission film in the first section.

10. The method to form a light transmission member according to claim 9, wherein the second light transmission film is formed after the first light transmission film is formed, the third light transmission film is formed after the second light transmission film is formed, and the fourth light transmission film is formed after the third light transmission film is formed.

11. The method to form a light transmission member according to claim 1, further comprising:

a process to form a plurality of focus portions on the plurality of sections on the light transmission films formed in the process to form the light transmission portions in the first section in the series of processes, after the series of processes.

12. The method to form a light transmission member according to claim 9, further comprising:

a process to form a plurality of focus portions on the plurality of sections so that the fourth light transmission film is positioned between the plurality of focus portions and a plurality of light transmission portions.

13. The method to form a light transmission member according to claim 1, further comprising:

a process to configure a channel at a boundary of the plurality of sections, after the series of processes.

14. The method to form a light transmission member according to claim 1, further comprising:

a process to form a plurality of focus portions on the plurality of sections after the series of processes, in which the focus of the focus portions formed on the first section is closer to the predetermined plane than the focus of the focus portions formed on sections other than the first section within the plurality of sections.

15. A method to form a light transmission member comprising:

a process including preparing a substrate on which a light transmission portion is to be disposed in each of a plurality of sections of a predetermined plane on the substrate, the plurality of sections including a first section, a second section, a third section, a fourth section, a fifth section, a sixth section, a seventh section, an eighth section, a ninth section, a tenth section, an eleventh section, a twelfth section, and a thirteenth section, regarding a first direction of the predetermined plane, the first section is between the second section and the third section, the second section and the third section are between the sixth and the seventh section, the second section is adjacent to the first section and sixth section, and the third section is adjacent to the first section and the seventh section, regarding a second direction that intersects the first direction of the predetermined plane, the first section is between the fourth section and the fifth section, the fourth section and the fifth section are between the eighth section and the ninth section, the fourth section is adjacent to the first section and the eighth section, and the fifth section is adjacent to the first section and the ninth section, and the first section is between the tenth section and the eleventh section, the second section and the fourth section are adjacent to the tenth section, the third section and the fifth section are adjacent to the eleventh section, the first section is between the twelfth section and the thirteenth section, the third section and the fourth section are adjacent to the twelfth section, and the second section and the fifth section are adjacent to the thirteenth section;

a first class process including a stage of using a spin coating method to form a first light transmission film in which the green color light transmittance is at or above 50%, and the red color and blue color light transmittance is below 50%, and a stage of removing a portion of the first light transmission film from at least the first section, the sixth section, the seventh section, the eighth section, the ninth section, the tenth section, the eleventh section, the twelfth section, and the thirteenth section, and to leave a portion of the first light transmission film on at least the second section, the third section, the fourth section, and the fifth section;

a second class process including a stage of using a spin coating method to form one of a second light transmission film in which the red color light transmittance is at or above 50%, and the green color and blue color light transmittance is below 50%, and a third light transmission film in which the blue color light transmittance is at or above 50%, and the green color and red color light transmittance is below 50%, and a stage of removing a portion of the one of the second light transmission film or the third light transmission film from at least the first section, and to leave a portion of the one of the second light transmission film or the third light transmission film in at least the sixth section, the seventh section, the eighth section, and the ninth section;

a third class process including a stage of using a spin coating method to form the other of the second light transmission film and the third light transmission film, and a stage of removing a portion of the other of the second light transmission film and the third light transmission film from at least the first section, and to leave a portion of the other of the second light transmission film and the third light transmission film in at least the tenth section, the eleventh section, the twelfth section, and the thirteenth section; and a fourth class process including a stage of using a spin coating method to form a fourth light transmission film in which the green color, red color, and blue color light transmittance is at or above 50% and leaving the fourth light transmission film in the first section.

16. The method to form a light transmission member according to claim 15, wherein the third light transmission film is formed after the second light transmission film is formed.

17. The method to form a light transmission member according to claim 16, further comprising:

a process to form the plurality of focus portions above the plurality of sections, across the fourth light transmission film.

18. A method to manufacture an image pickup device including a light transmission member including a plurality of light transmission portions having different light transmission properties, and a semiconductor substrate including a plurality of photoelectric conversion portions to photoelectrically convert light transmitted by each of the plurality of light transmission portions;

wherein the method to form a light transmission member according to claim 1 is used to form the light transmission members.

19. A method to manufacture an image pickup device including a transmission member including a plurality of light transmission portions having different light transmission properties; and a semiconductor substrate including a plurality of photoelectric conversion portions to photoelectrically convert light transmitted by each of the plurality of light transmission portions;

wherein the method to form a light transmission member according to claim 15 is used to form the light transmission members.

20. A method to form a light transmission member comprising:

a series of processes to form light transmission portions, each of the processes including forming a light transmission film and leaving the light transmission film in any of a plurality of sections of a predetermined plane, and each of the processes being performed for each formation of each light transmission film having different light transmission properties, the plurality of sections of the predetermined plane including a first section, a second section, a third section, a fourth section, a fifth section, a sixth section, a seventh section, an eighth section, and a ninth section, regarding a first direction of the predetermined plane, the first section is between the second section and the third section, the second section and the third section are between the sixth and the seventh section, the second section is adjacent to the first section and sixth section, and the third section is adjacent to the first section and the seventh section, regarding a second direction that intersects the first direction of the predetermined plane, the first section is between the fourth section and the fifth section, the fourth section and the fifth section are between the eighth section and the ninth section, the fourth section is adjacent to the first section and the eighth section, and the fifth section is adjacent to the first section and the ninth section, wherein the light transmission portion disposed in the first section exhibits a transmittance at or above a predetermined value in all of wavelength band in which the light transmission portions disposed in each of the second section, the third section, the fourth section, and the fifth section exhibit transmittance at or above the predetermined value, and also the light transmission portion disposed in the first section exhibits a transmittance at or above the predetermined value in at least part of wavelength band in which the light transmission portions disposed in each of the second section, the third section, the fourth section, and the fifth section exhibit transmittance below the predetermined value, and wherein, in the series of processes, after the light transmission portions are formed for the second section, the third section, the fourth section, and the fifth section, the light transmission portions are formed for the first section, the sixth section, the seventh section, the eighth section, and the ninth section.

* * * * *